United States Patent [19]

Karasawa

[11] Patent Number: 5,463,341
[45] Date of Patent: Oct. 31, 1995

[54] ELECTRONIC MULTIPLE-VALUED REGISTER

[75] Inventor: Shinji Karasawa, Natori City, Japan

[73] Assignee: Miyagi National College of Technology, Natori City, Japan

[21] Appl. No.: 98,830

[22] Filed: Jul. 29, 1993

[30] Foreign Application Priority Data

Dec. 9, 1992 [JP] Japan ................................ 4-329398

[51] Int. Cl.[6] .............................................. H03K 17/693
[52] U.S. Cl. .......................... 327/219; 327/194; 327/220; 327/403
[58] Field of Search ............................ 328/13; 307/261, 307/291, 570, 289, 268, 321, 296.3, 296.1, 296.6, 279, 272.2; 327/194, 219, 220, 403, 421, 584, 215; 326/56; 365/202; 377/97

[56] References Cited

U.S. PATENT DOCUMENTS

| | | | |
|---|---|---|---|
| 3,155,833 | 12/1959 | Fries | 307/291 |
| 3,292,014 | 1/1965 | Brooksby | 307/291 |
| 3,849,673 | 11/1974 | Koo | 307/279 |
| 4,438,351 | 3/1984 | Schnermeyer | 307/291 |
| 4,442,509 | 4/1984 | Herndon | 365/154 |
| 4,491,745 | 1/1985 | Birch | 307/264 |
| 4,517,475 | 5/1985 | Petty | 307/291 |
| 4,595,999 | 5/1986 | Betirac | 365/154 |
| 4,780,751 | 10/1988 | Nishimoto | 365/154 |
| 4,855,617 | 8/1989 | Ovens | 307/291 |
| 4,883,985 | 11/1989 | Katsu et al. | 307/279 |
| 5,043,939 | 8/1991 | Stamowitz et al. | 307/291 |

OTHER PUBLICATIONS

Sueo Tanaka et al; "An Analysis on the Phase Place of the Tristable Circuits"; Denshin Tsushin Gakkai, 69/11 vol. 52-C, pp. 667-674; 1969 and abridged translation thereof.
H. Arango et al., "Threshold Implementation of Ternary Systems", IEEE Transactions on Electronic Computers, EC-15, p. 661, Jan. 10, 1966, revised May 6, 1966.
Sueo Tanaka, et al, "An Analysis on the Phase Plane of the Tristable Circuits", Electron Communication Association Review '69/11, vol. 52-C, No. 11, UDC 621.373.52: 621.382.323, pp. 667-674, 1969.
Hisashi Mine, et al, "Tri-Stable Circuit Using FET", Electron Communication Association Review '68/11, vol. 51-C, No. 11, UDC 621.382.323: 621.374.3, pp. 532-533, 1968.
Shinji Karasawa et al; "Metal-Oxide-Semiconductor Field-Effect-Transistors Possessing Step Functional I-V Curves Caused by the Punch Through between Drain and Inversion Layer of the Gate"; Jpn. J. Appl. phys. vol. 31, pp. 217-224; Feb. 1992.
Shinji Karasawa et al; "Applications of a MOS Device with Stair Shaped I-V Curve"; International Conference on Advanced Microelectronic Devices and Processing; pp. 621-624.
Shinji Karasawa et al; "Design and Examination of a Multiple-Valued Flip-Flop Circuit with Stair Shaped I-V Curved Device as a Coupling Element"; IEEE Computer Society Press Reprint; pp. 152-157; 1993.

*Primary Examiner*—Timothy P. Callahan
*Assistant Examiner*—My-Trang Nu Ton
*Attorney, Agent, or Firm*—Stevens, Davis, Miller & Mosher

[57] ABSTRACT

An electric multiple-valued register for electrically maintaining a multiple-valued digital signal of a ternary value of $(0, \frac{1}{2}, 1)$, quaternary value of $(0, \frac{1}{3}, \frac{2}{3}, 1)$ or quinternary value of $(0, \frac{1}{4}, \frac{2}{4}, \frac{3}{4}, 1)$ instead of a binary digital signal such that 1 digit is of 0 or 1 is realized by inserting an element having a stair shaped voltage-current characteristic into a coupling circuit of a conventional flip-flop circuit. It may be used for a quantization circuit with the aid of a step characteristic, a multivalued memory, a multivalued register, a multivalued loop memory, a multivalued pattern matching circuit, a voice recognition divide, pattern recognition device, or a associative memory device.

15 Claims, 23 Drawing Sheets

FIG_1

FIG_2

FIG_13

FIG._14

FIG_15

FIG_17a
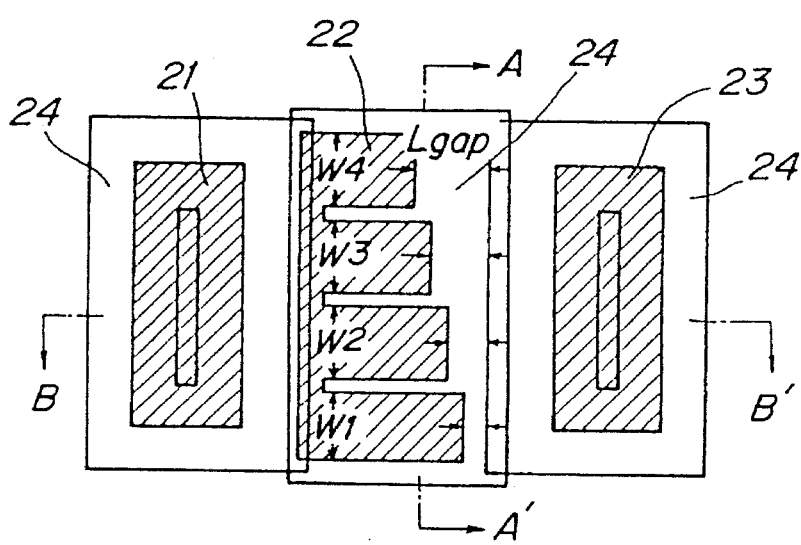
FIG_17c
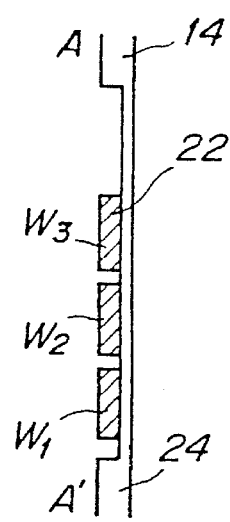
FIG_17b
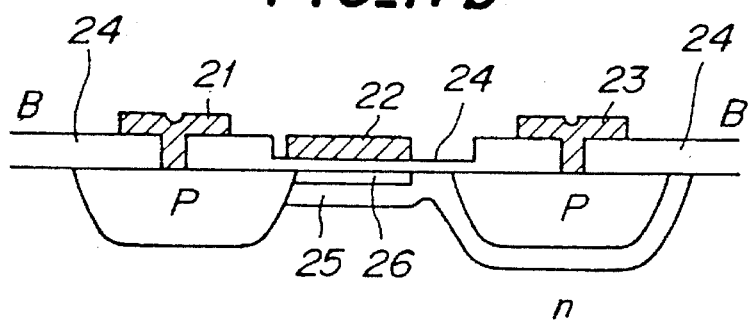

FIG_23
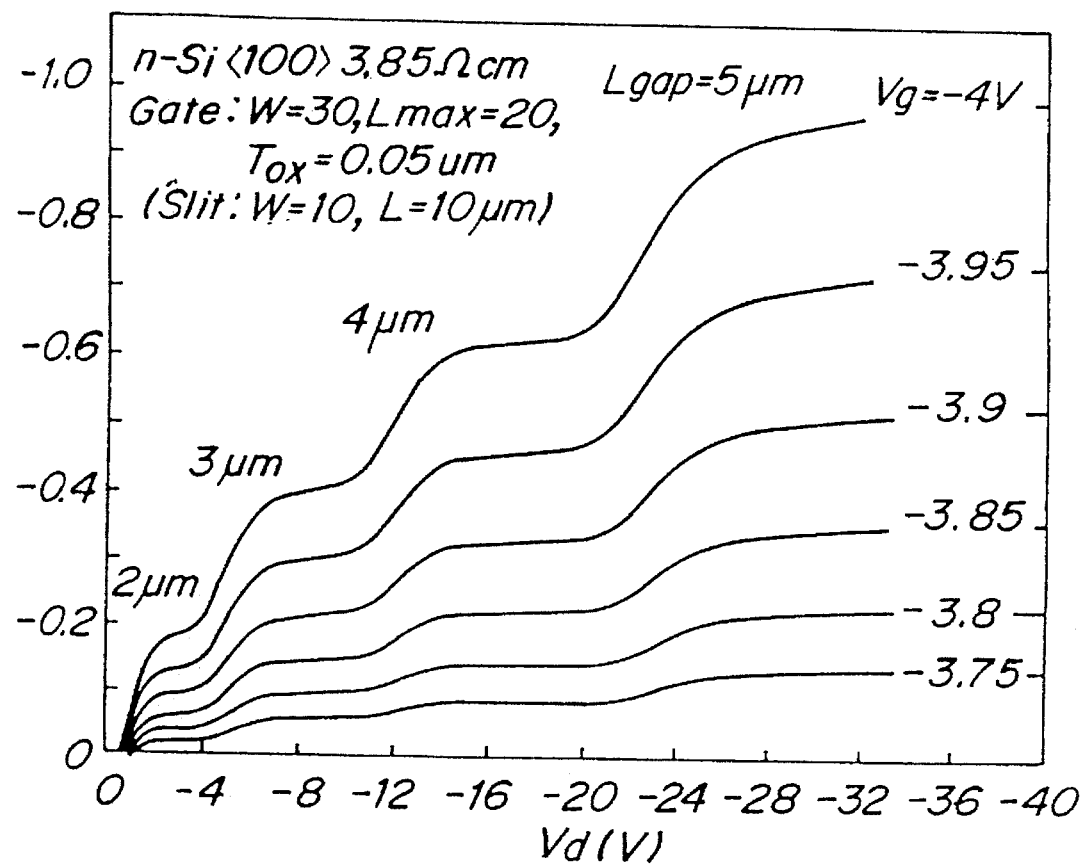

ELECTRONIC MULTIPLE-VALUED REGISTER

BACKGROUND OF THE INVENTION

1. Field of the Invention

The present invention relates to an electric multiple-valued register for electrically maintaining a multiple-valued digital signal, such as ternary value of (0, ½, 1), quaternary value of (0, ⅓, ⅔, 1) or quinternary value of (0, ¼, 2/4, ¾, 1), instead of a binary digital signal such that 1 digit is either 0 or 1. The present invention maintains a multiple-valued digital signal by inserting an element, having a stair shaped voltage-current characteristic, into a coupling circuit of a conventional flip-flop circuit. An industrially applicable field for applying the present invention is in different kinds of information processing apparatus such as multivalued computers. The present invention is particularly suitable for constructing a real time analog-digital mixed parallel distribution processor, such as a voice recognition processor. As an actual use, mention may be made of a quantization circuit with the aid of a step characteristic, a multivalued memory, a multivalued register, a multivalued loop memory, a multivalued pattern matching circuit, a voice recognition divide, a pattern recognition device, an associative memory device and the like.

2. Related Art Statement

A binary digital system using a flip-flop circuit as a conventional binary registering circuit has actively been developed by integrated circuit techniques, and in recent VLSI and ULSI development, a wiring amount within a chip is increased to occupy more than 70% thereof. Therefore, a multivalue computer is highly expected, and multiple-valued information processing, such as multivalued arithmetic operation and the like, has been studied.

A conventional study of multiple-valued logic was focused on algorithms, with the hardware based on binary digital system circuits. Therefore, a conversion of binary value into multiple value or multiple-valued operation circuit became complicated this cancelling the merit of the arrangement.

As a multiple-valued flip-flop circuit having a number of stable values, there is a flip-flop circuit having three stable values disclosed by Arango et al (IEEE Trans., EC-15, p. 661, 1966) or Tanaka et al (The Transactions of the Institute of Electronics and Communication Engineers, Vol. 52-C, No. 11, p. 667, 1969). These circuits materialize three stable values by using a plurality of source voltages, and in such a circuit, difficulty increases as multivalued numerals are increased to four-valued and five-valued. Hitherto, the flip-flop circuit depends upon the previous state, so that it has been constructed by considering its algorithm as a sequential logic circuit. It was difficult to understand that the value taken by the flip-flop circuit is increased to three-valued and four-valued when we are aware of sequential logic.

In other words, multiple-valued logic has been studied by substantially keeping pace with binary logic, but the time when a practical study is advanced is quite recent when internal wiring has occupied many portions within chip and micronization has reached the limit. Moreover, it is desired in future digital information processing to handle information of ambiguous form, such as in neural networks or voice networks having the same function as neural networks of human brains. In this case, even with uncertain information, it is necessary to call storaged information most closely related to the uncertain information. If there are multiple-valued registers and multiple-valued memories, information can be processed in a parallel dispersion manner with an analog sense. These circuits can be constructed with a multiple-valued flip-flop circuit having a registering function, and a compact multiple-valued flip-flop circuit is important.

Ternary and quaternary flip-flop circuits and logic circuits have variously been studied so far. However, a conventional binary flip-flop circuit functions as a sequential logic circuit element, but in case of more than quaternary states, the state setting of its algorithm becomes very complicated, and its merits are cancelled out. There was no breakthrough for improving multiple-valued flip-flop element having such information processing function that multivalues are simply held and stored.

At the developing age of post binary computers such as neural-net fuzzy logic, multiple-valued logic and the like, a compact multiple-valued registering circuit has become very important.

Arithmetic operations, such as addition, are possible with a simple analog circuit by materializing a circuit for merely placing multivalued values. It is possible to greatly contribute to putting multivalued computer to practical use by only materializing a circuit for setting and maintaining multivalued values as an electronic multiple-valued register.

SUMMARY OF THE INVENTION

An object of the present invention relates to an electric multiple-valued register in a flip-flop circuit as an electronic binary registering circuit, comprising elements having stair shaped voltage-current characteristics into circuits for mutually coupling from an output to an input of inverted amplifying circuits as a pair, and a circuit constructed for electrically maintaining at least tertiary or quaternary multiple-valued signals.

Another object of the present invention is to provide a multiple-valued register, comprising a stair shaped gap inserted between the gate and the drain of a MOSFET element (MSFMOSFET) having a stair shaped voltage-current characteristic inserted, for mutually coupling from an output to an input of inverted amplifying circuits as a pair, and a generated output maintained at a stable state, thereby constructing a semiconductor integrated circuit of maintaining multiple-valued digital signals.

Another object of the present invention is to provide a multiple-valued register, wherein stair shaped voltage-current characteristics should be constructed to maintain the complementary relation of {one constant current state ($Q_A$) setting the other constant current state ($Q_B$): ($Q_A+Q_B$)=1, $V_{rn}(Q_A)$+ $V_{rn}(Q_B)$=VCC}; where, VCC is the applied voltage to the circuit, $V_{rn}(Q_A)$ is a voltage between an output ($Q_A$) applied point and ground and $V_{rn}(Q_B)$ is a voltage between an output ($Q_B$) applied point and ground.

BRIEF DESCRIPTION OF THE DRAWINGS

For a better understanding of the invention, reference is made to the accompanying drawings, in which:

FIG. 17a is a plan view and FIGS. 17b and 17c are cross-sectional views showing the structure of a multiple step function MOSFET;

FIG. 23 is a voltage-current characteristic diagram of the multiple step function MOSFET having a gate length of 20 μm.

Figure 1:
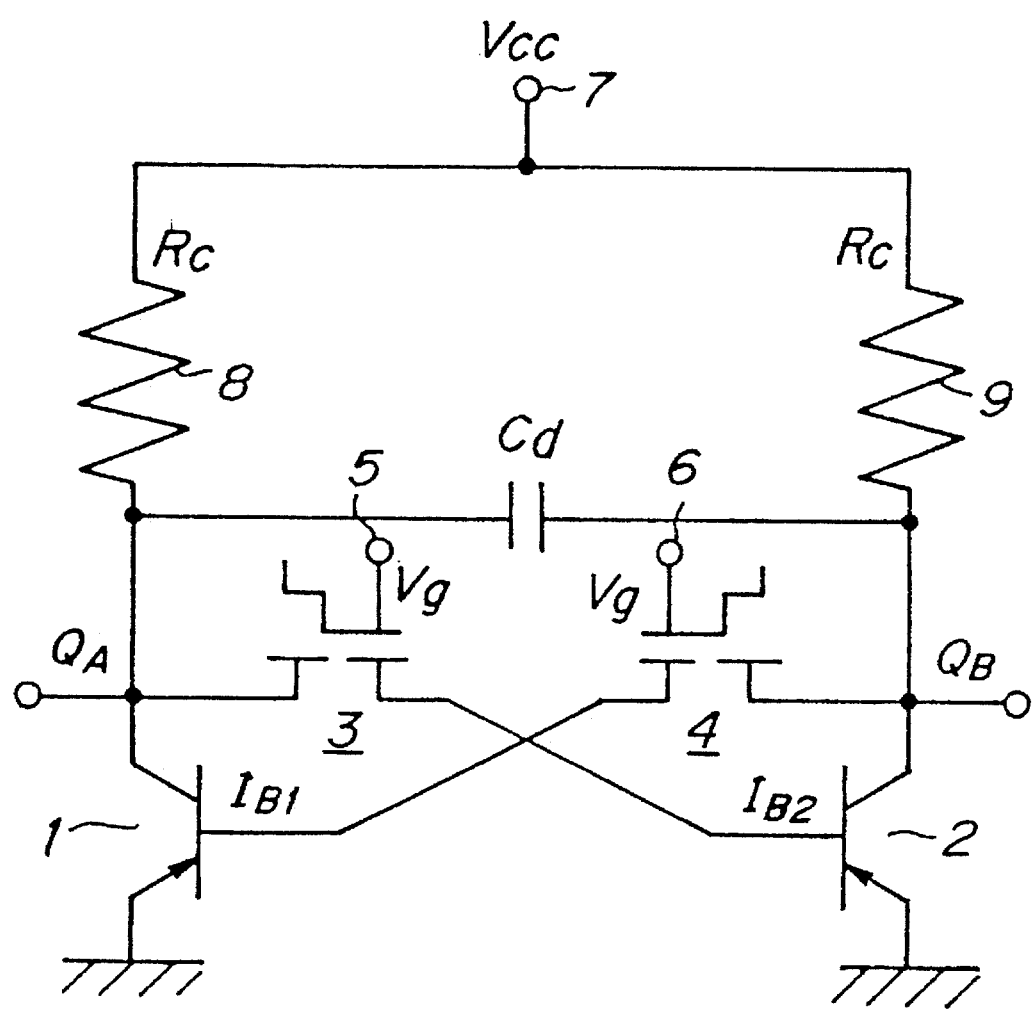
FIG. 1 is a stair shaped multiple-valued flip-flop circuit diagram using a coupling circuit element having a step-like I-V characteristic.

Explanation of the Reference Numerals are as follows 1, 2 are inversion amplifier circuits, 3, 4 are multiple step function elements, 8, 9 are resistance elements, 11A, 11B are pnp transistors, 12A, 12B are npn transistor, 21 is a source, 22 is a gate, 23 is a drain, 24 is a gap, 25 is a depletion layer, 26 is an inversion layer, and $Q_A$, $Q_B$ are output terminals.

DESCRIPTION OF THE PREFERRED EMBODIMENT

The circuit of the present invention performs the action of a multiple-valued flip-flop circuit as follows.

Under a constant current state, even if a voltage is slightly varied, the current state is not varied and its state is maintained. On the other hand, in the region where current is suddenly varied, the current of a coupling circuit largely increases with little voltage increase and thus a positive feedback loop is formed.

More specifically, when an input current of the other transistor MOSFET 3 is increased with a voltage increase of an output terminal of one transistor $Q_A$ of a flip-flop circuit, a collector output voltage of the transistor $Q_B$ which current state is stepped up is stepped down by load resistance. The output voltage of the stepped-down transistor $Q_B$ steps down the current state of the one transistor $Q_A$, and the collector voltage of the transistor $Q_A$ is stepped up by load resistance to form a positive feedback loop. Thus, the transistors perform the action of local flip-flop within a limited range.

In an actual circuit, even under the constant current state, a transmission loop of a component is formed by parallel capacitance parasitic to the coupling circuit to cause oscillation, but in the case of small parasitic capacitance, this oscillation can be prevented by electrostatic capacitance between both collectors.

According to the present invention, a circuit for electrically maintaining a multiple-valued digital signal such as pentanary of (0, ¼, ²⁄₄, ¾, 1) can be formed instead of 0 or 1 in one digit by a multiple-valued registering circuit. In other words, a conventional register of a binary digital signal, such as an abacus having one bead for one digit, can be changed to a common abacus having four beads for one digit.

The present invention can process multivalued information as binary digital information by a multiple-valued registering device, and provides a circuit for addition operation such as transmitting much information by one wiring and adding an analog circuit in a inter-medium circuit so as to simplify circuit construction.

The present invention constructs a multiple-valued registering circuit for maintaining a stable values of stair numbers of steps by using an element (i.e a multiple-step function MOSFET) of staired·voltage-current characteristics as a conventional flip-flop coupling circuit. The multiple-step function element comprises a constant voltage high dynamic resistance portion for stepping a current and a low dynamic resistance portion for maintaining a current, and the coupling circuit causes state transition at the low resistance portion and maintains the state at the high resistance portion.

The multiple step function element outputs a stepping current to a voltage input, so that as a series-connected current amplifier, it is preferable to lessen the influence exerted upon the input as much as possible. The voltage of a base-emitter junction of a bipolar transistor is low and the impedance thereof is low, so that the bipolar transistor is suitable for taking out a current of the multiple-step function element. That is, the bipolar transistor is a circuit for connecting the multiple step function element to the input voltage and the base of the transistor is for outputting a voltage from load resistance of the collector. The quantization circuit consists of three parts. That is, the multiple step function element, the bipolar transistor and the load resistance. When a pair of the circuits are connected to each other, it is possible to form a multiple-valued registering circuit with the same simple circuit construction as that of a conventional flip-flop circuit. This circuit can construct a multiple-valued resister and a multiple-valued memory. A system of this multiple-valued flip-flop circuit does not require analog-to-digital conversion, and even if an input is analog, when a current is input by controlling a gate by a timing pulse a sampled, analog sensual information, can be transferred in the manner of digital technique. Analog sensual information is highly parallel distributed information, e.g. for sound or visual recognition. Thus, a system for carrying out a parallel dispersion processing can be materialized with real time basis.

For example, a voice can be recognized by a spectrum pattern time-changing the strength by every frequency component. This pattern recognition can be materialized by such a circuit that a memory arranged with a multiple-valued flip-flop circuit and an information transfer line of input data are paired, logarithms of identification kinds are arranged in parallel, respective stored voices and pattern matching are examined, and the most agreed voice address is output.

The parallel dispersion processing is to arrange logarithms multiplied frequency bands by voice number of identification kind and to align a great number of cells corresponding to maximum time division number in each pair, so that it is desirable to examine agreement with analog sense by using information as multiple-value. The present invention does not require an unadaptable complicated digital circuit for a parallel dispersion processing circuit taking originally incomplete input information.

Circuit processing of an analog signal is sufficient for the present invention. When the stair typed multiple-valued flip-flop circuit is used for such parallel dispersion processing system, it is possible to process with a circuit of an analog signal, and the processing becomes remarkably simplified as compared with a parallel dispersion processing constructed by the conventional digital circuit.

The circuit configuration and its conditions according to the present invention will be explained by referring to the accompanying drawings.

FIG. 1 is a circuit diagram of a stair typed multiple-valued flip-flop with the use of coupled circuit element of stepped I-V characteristics. In FIG. 1, $Q_A$ shows an output of one constant current state, and $Q_B$ shows an output of the other constant current state. $R_C$, 8 and 9 are resistances.

As shown in FIG. 1, there are provided a pair of inversion amplifiers 1, 2, and their outputs are mutually connected to the other inputs by multiple step function elements to construct a multiple-valued flip-flop circuit. Here, Cd is a stabilized capacitors for the purpose of eliminating oscillation, and as for the multiple step function elements 3, 4, use was made of MSF MOSFET gate. This circuit maintains stable values of a number of steps by using a multiple step function element SFMOSFET for a conventional flip-flop coupling circuit, so that when its characteristics is tried to be expressed, it is called a stair shaped multiple-valued flip-flop circuit. $V_g$ is a bias voltage of a gate.

In a constant current region of the step function elements 3, 4, the value of dynamic resistance becomes large and to be a blocking region, and in a region where a current surges stepwise, the value of dynamic resistance becomes small and to be a leaping region, and a plurality of stable states are exist.

That is, the number of kinds of stable values of this flip-flop is determined by the number of steps of the MSF MOSFET having a stair shaped gap between gate and drain.

As a constituent condition of the present device, one stable state and the other stable state stably maintain their complementary relation.

In a quaternary stair shaped flip-flop circuit, as a condition of a stable current state, a multiple step function element is set to establish the relation of formulae (1).
[Relation 1]

$I_{B11}=(1/8) (V_{cc}/R_c) (1/h_{FE})$ when $V_{c2}=0-1/4$ $I_{B12}=(3/8) (V_{cc}/R_c) (1/h_{FE})$ when $V_{c2}=1/4-2/4$ $I_{B13}=(5/8) (V_{cc}/R_c) (1/h_{FE})$ when $V_{c2}=2/4-3/4$ $I_{B14}=(7/8) (V_{cc}/R_c) (1/h_{FE})$ when $V_{c2}=3/4-4/4$ \hfill (1)

To $V_{c1}$, the formulae $I_{B21}$, $I_{B22}$, $I_{B23}$ and $I_{B24}$ are made in the same relation as in the relation of formulae (1).

Figure 2:
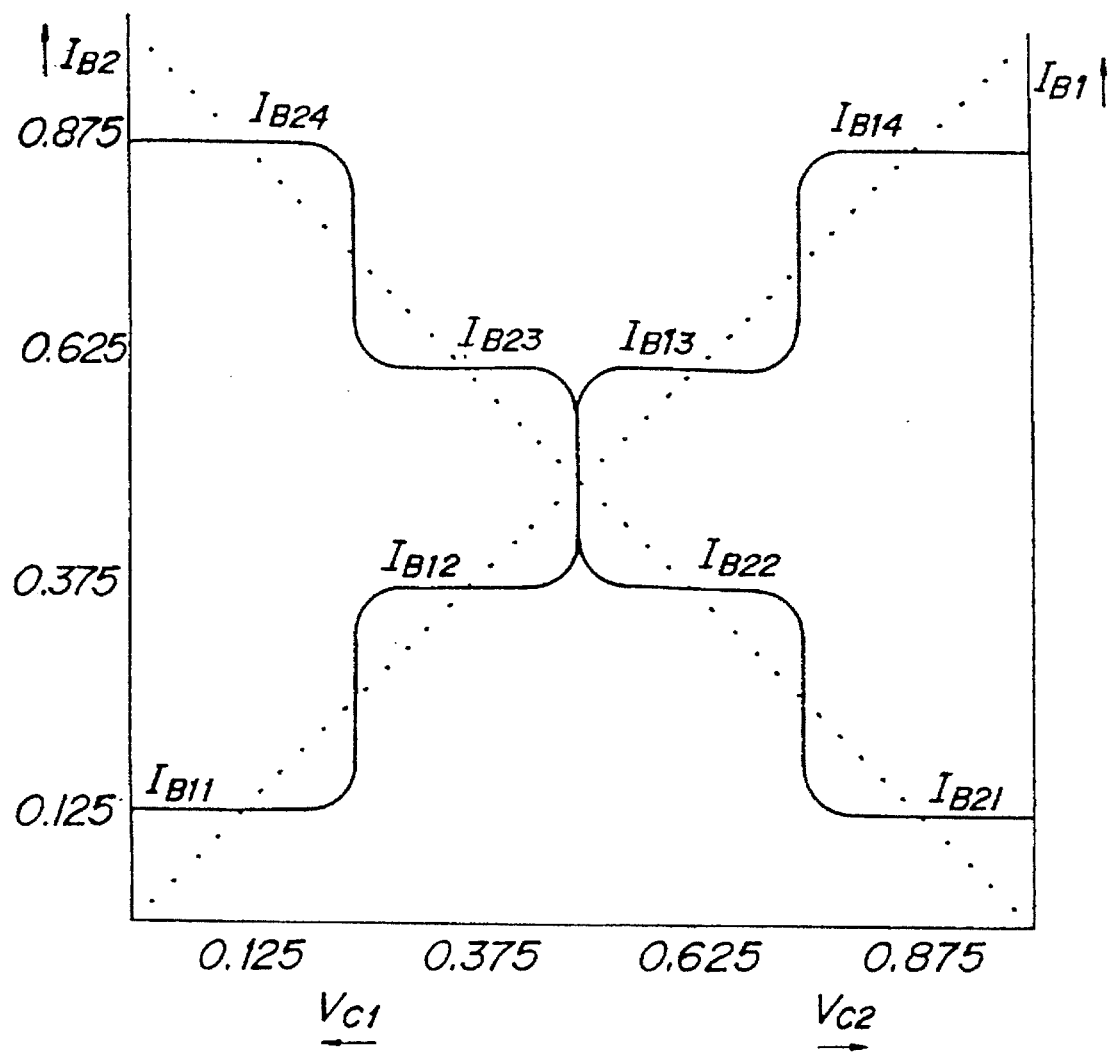
FIG. 2 is a characteristic diagram showing a coupling condition of the stair shaped multiple-valued flip-flop circuit.

FIG. 2 shows these relations. Moreover, outputs $Q_A$ and $Q_B$ are in the complementary relation as shown in Table 1.

TABLE 1

Relation of Outputs of Stair Shaped Multiple-Valued Flip-Flop Circuit

| QA | 1/8 | 3/8 | 5/8 | 7/8 |
|----|-----|-----|-----|-----|
| QB | 7/8 | 5/8 | 3/8 | 1/8 |

The design condition of a high frequency characteristic is as follows. Direct current resistance under the constant current state of a coupling circuit is very large, but high frequency impedance decreases by parasitic capacitance, and varied voltage is bypassed to cause oscillation in the same manner as stable multivibrator. Therefore, in the coupling circuit of the flip-flop of the present invention, a stabilized capacitor (Cd) is inserted between two outputs ($Q_A$ and $Q_B$), and a high frequency gain of the loop is suppressed as shown in FIG. 1. This stabilized capacitor (Cd) is connected to a terminal of a phase opposite to a speed-up capacitor of a usual flip-flop circuit, so as to reduce a loop gain of a high speed response contrary to the speed-up capacitor. In case of small parasitic capacitance, it is possible to stabilize the stable state of an intermediate level by this stabilized capacitor.

In the case of estimating a value of the capacitor Cd, if a coupling circuit of an ideal stair characteristic is assumed, let an output voltage of the stationary state where a positive feedback loop is interrupted and a potential difference of a trigger input be as follows:

$$\Delta V = (V_n - V_{n-1})$$

the transition occurs at the half value of a stair step voltage. The time required for this transition is half value Th=0.7 R·Cd, where, R is resistance of a trigger circuit, and this time lag Th does not become too large. Moreover, a load $\Delta Q$ stored in the capacitor Cd in this period becomes $$\Delta Q = 0.5\ \Delta V \cdot Cd.$$

A multiple-valued flip-flop circuit manufactured for trial by the inventor maintains one value within several stable states if there is no input. This state can be shifted to another stable state by an external voltage, and in this case, the other output terminal is shifted to a complementary stable state.

Elements having stair shaped voltage-current characteristics are inserted into the inversion amplifiers I-B1 and I-B2 paired with coupling circuits of the flip-flop.

When an input of the stair shaped voltage-current characteristic is horizontal, the flip-flop circuit becomes stable, whereas the input is instantly stepped up under the vertical state.

FIG. 2 shows a voltage current characteristic diagram in a coupling condition of the stair shaped multiple-valued flip-flop.

EXAMPLE 1

Figure 3:
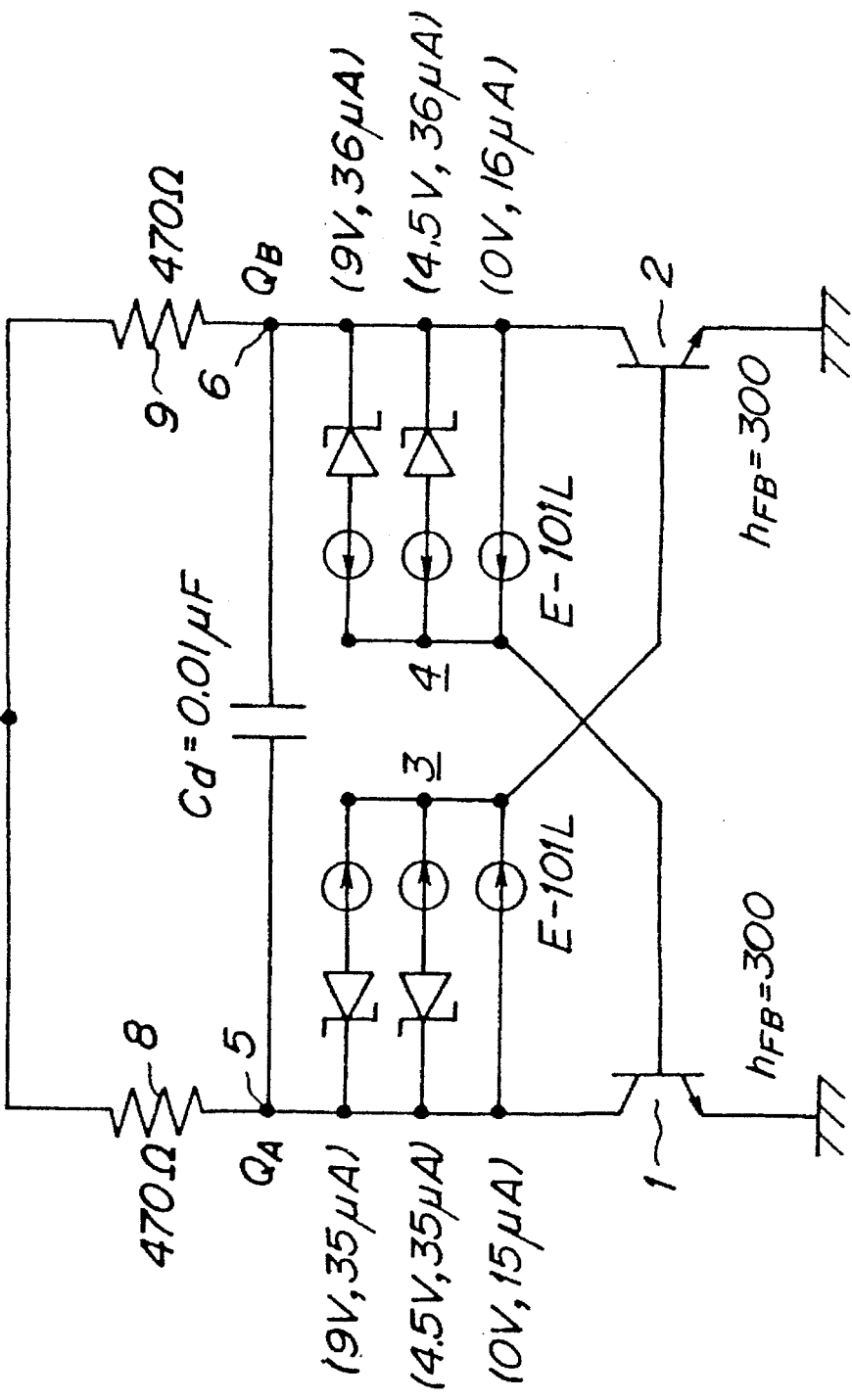
FIG. 3 is a circuit diagram of a stair shaped ternary flip-flop circuit manufactured for trial by the present inventors.
Figure 4:
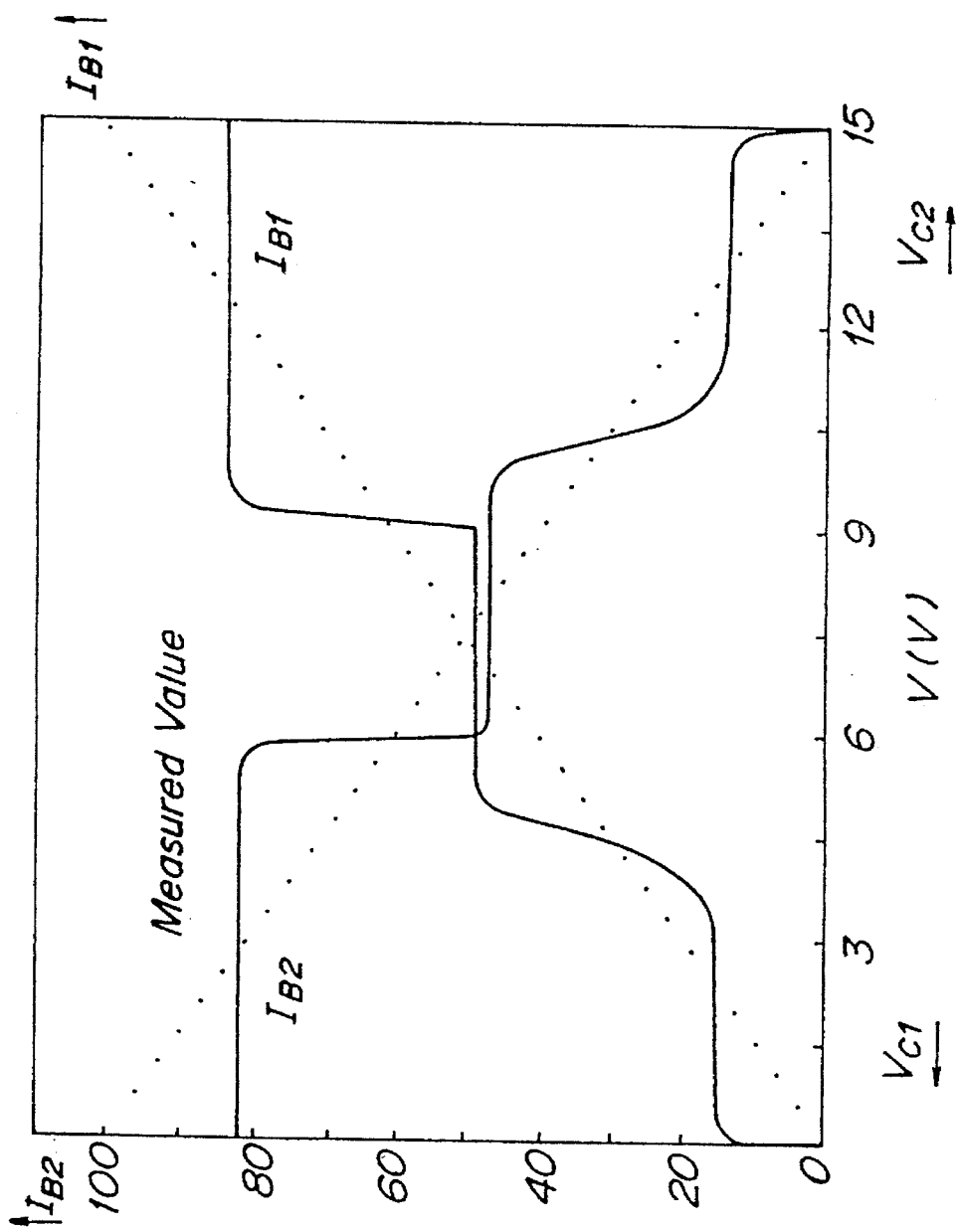
FIG. 4 is a characteristic diagram of a coupling circuit of the ternary flip-flop circuit by discrete diodes.

A flip-flop having stair shaped voltage-current characteristics was manufactured by using a constant current diode (E-101L) consisting of individual parts and a Zener diode, and a multiple-valued flip-flop circuit was manufactured with the use of discrete parts. FIG. 3 shows a circuit diagram of a stair shaped ternary flip-flop circuit manufactured for trial at this time, and FIG. 4 shows a measured voltage-current characteristics of the coupling circuit. Each element in FIG. 3 is denoted with the same value as that of each element providing the same role in FIG. 1.

When a signal is directly input in one output terminal $Q_A$ of the stair shaped multiple-valued flip-flop circuit, a quantized output is observed in the other output terminal $Q_B$.

Figure 5:
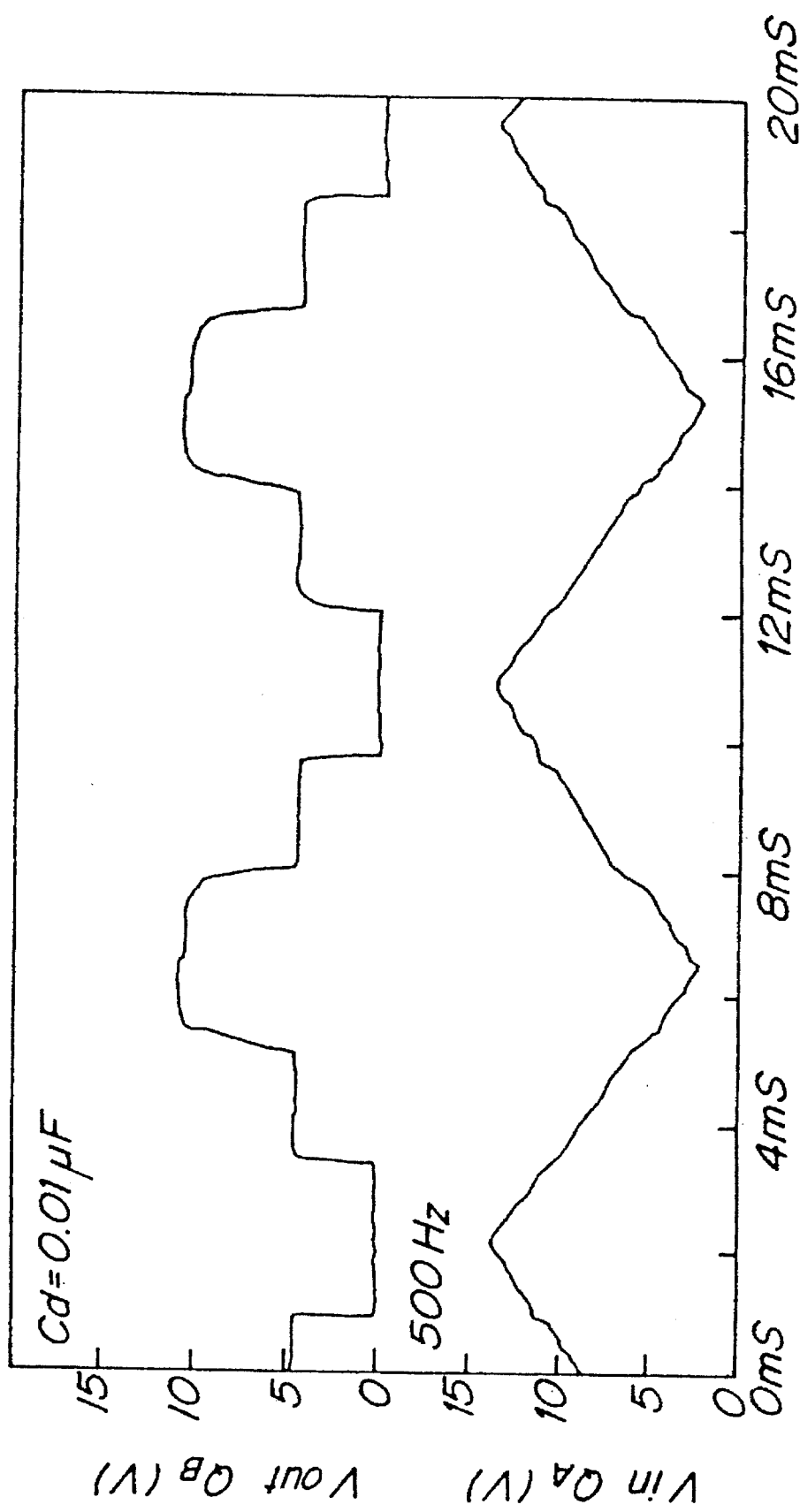
FIG. 5 is a quantized characteristic diagram of the stair shaped ternary flip-flop circuit by direct input.

FIG. 5 shows a waveform of the other output terminal $Q_B$ when one output terminal $Q_A$ is provided with a triangular wave. In FIG. 5, $V_{IN}$ shows an input voltage of one terminal $Q_A$ and $V_{OUT}$ shows an output voltage of the other output terminal $Q_B$. A capacitance of the coupling capacitor is Cd=0.01 µF.

Figure 6:
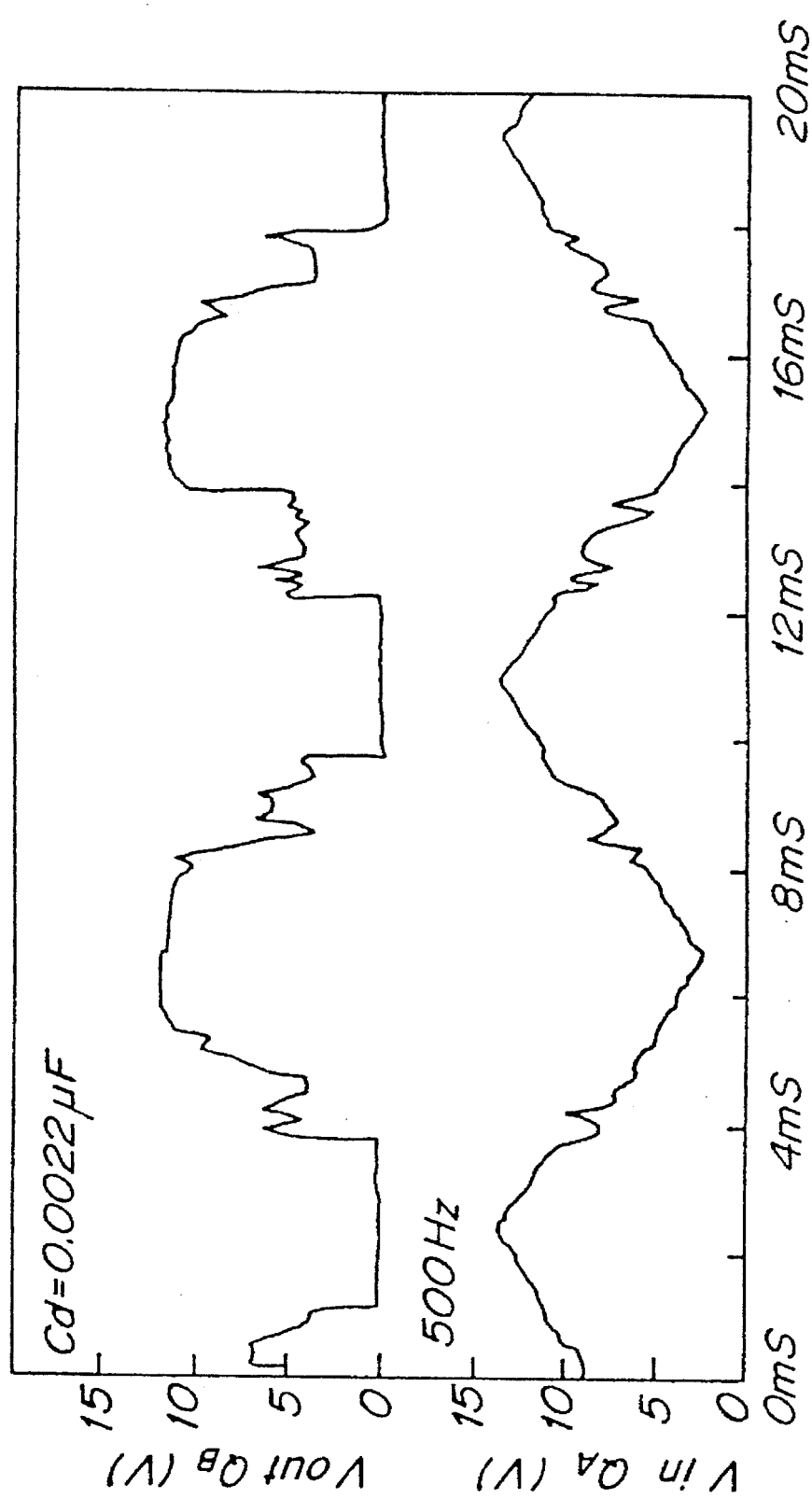
FIG. 6 is a characteristic diagram showing oscillation of an intermediate stable state (when the capacitance of a stabilized capacitor is insufficient)

FIG. 6 shows an oscillation waveform generated in the neighborhood of an intermediate stable state when a stabilized capacitor value is small.

Figure 7:
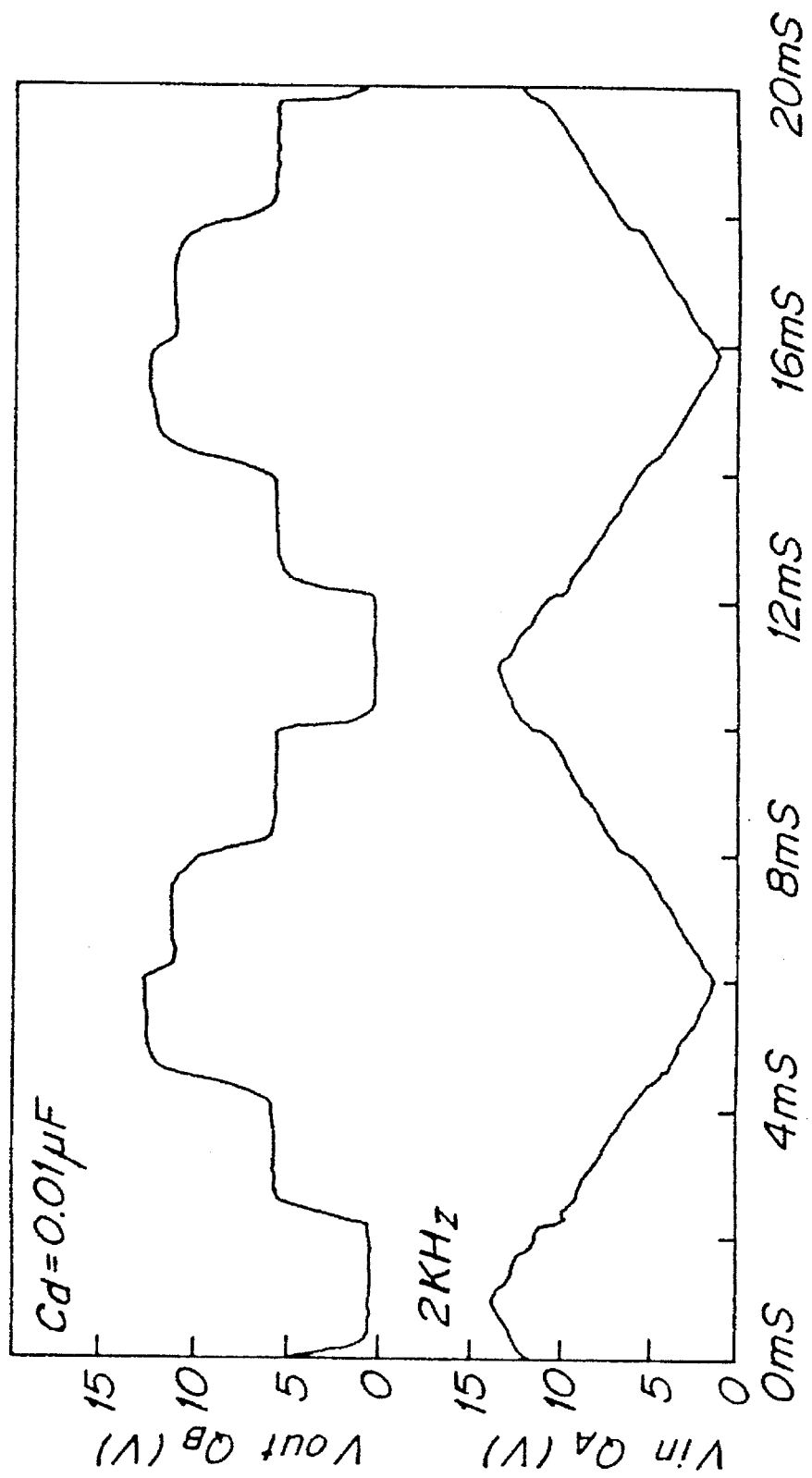
FIG. 7 is an output waveform quantized at repeating 2 kHz.

When the stabilized capacitor value is excessively large, a quantized waveform is deformed and a stair characteristics becomes soft, and the intermediate stable level value decreases. When an input repeated frequency is increased, the response waveform becomes as shown in FIG. 7. The upper limit of the repeated frequency of this circuit is about 5 kHz, and has room for improvement by reduction of electrostatic capacitance.

Figure 8:
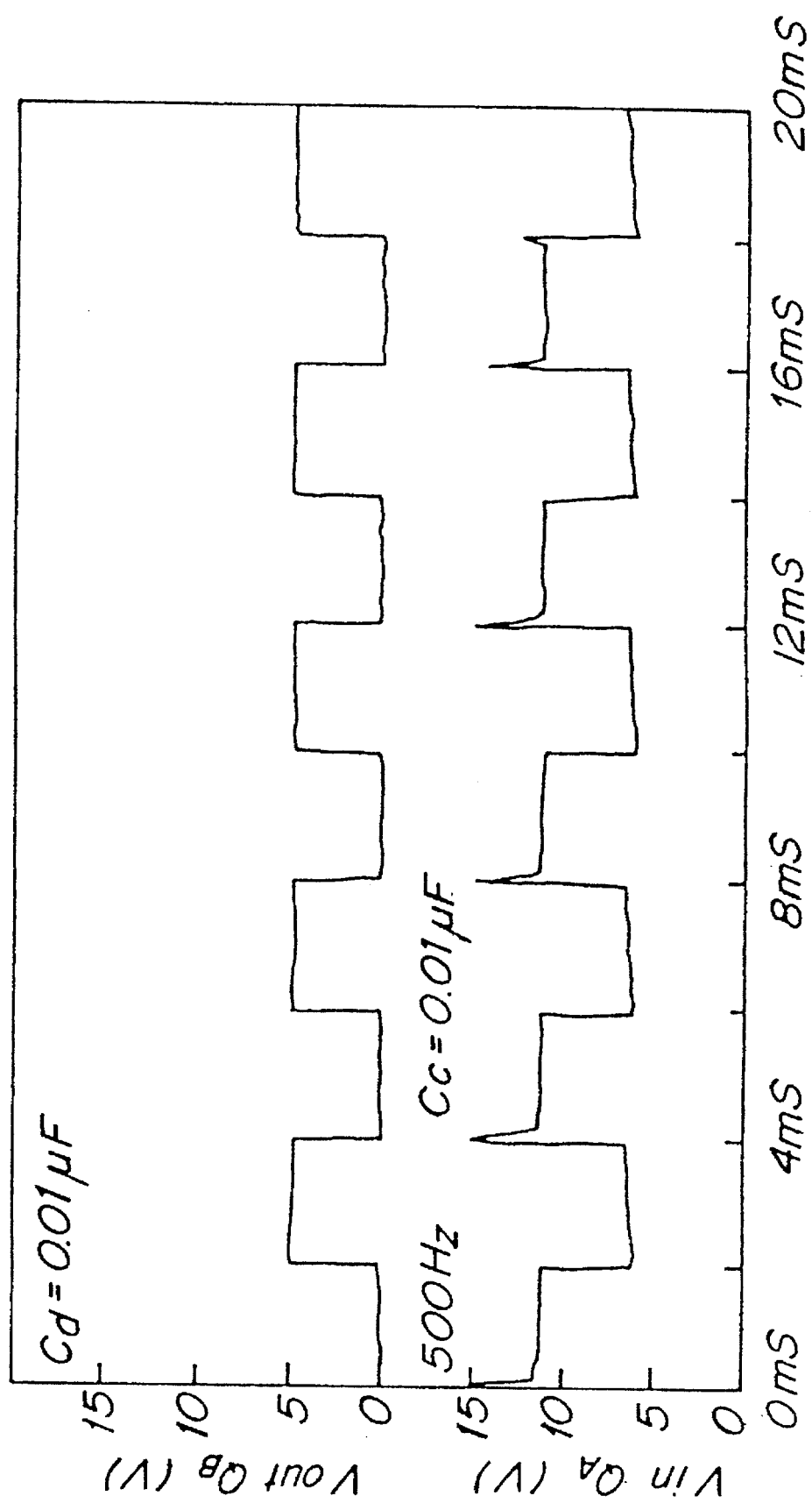
FIG. 8 is a characteristic diagram in the case of adding a trigger wave through a coupling capacitor.
Figure 9:
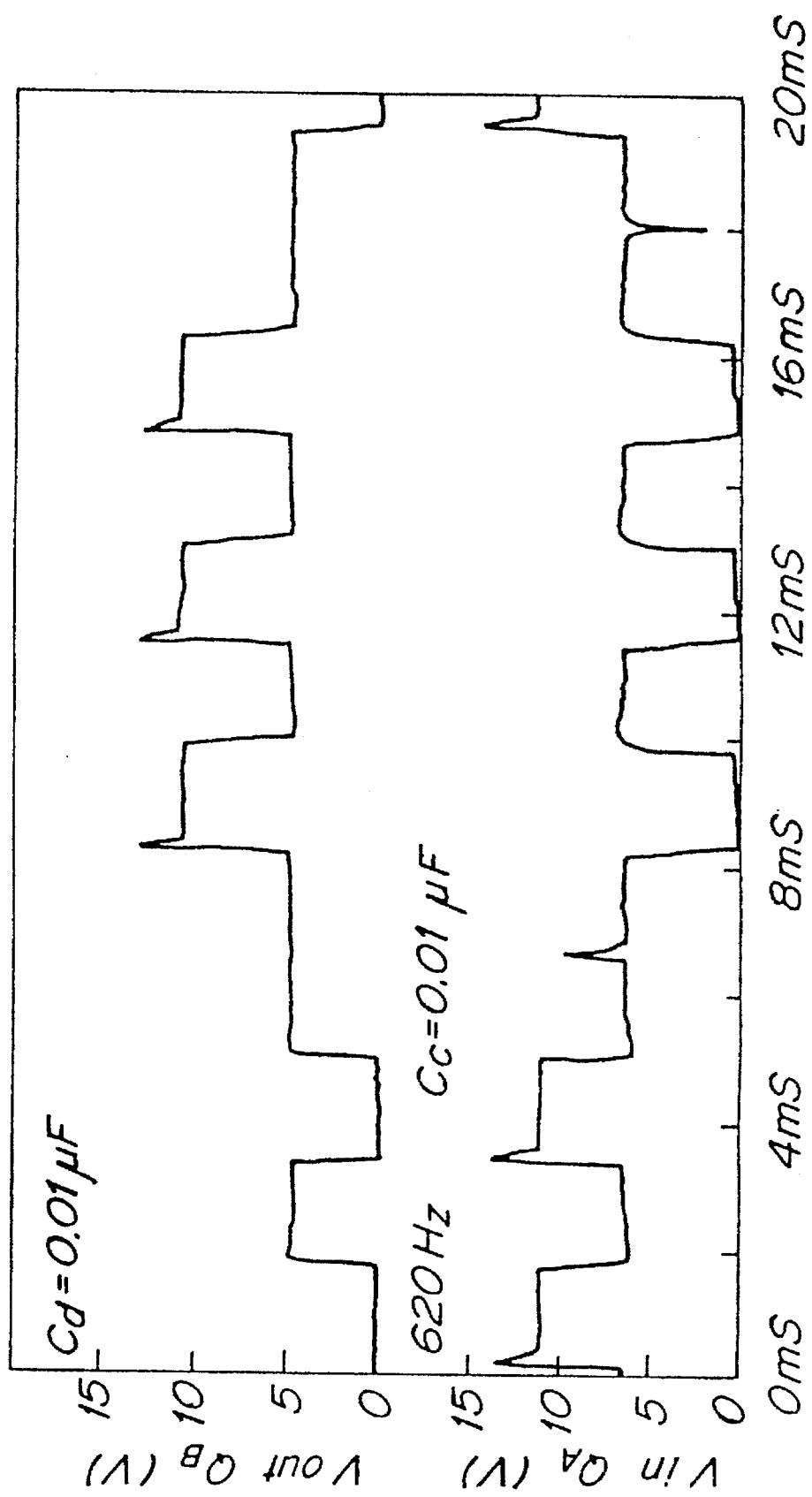
FIG. 9 is a characteristic diagram showing three stable states in the case of adding a trigger wave of a small amplitude through the coupling capacitor.

A dynamic response characteristic of the multiple-valued flip-flop can be examined by using a coupling capacitor. When a rectangular wave is added to the coupling capacitor Cd, a plus trigger pulse and a minus trigger pulse are generated by a differential circuit characteristic and added to the multiple-valued flip-flop circuit as voltage pulses, and there is obtained a waveform synchronizing with the input as shown in FIG. 8 which is alternately taking two states. FIG. 9 shows waveforms of the input side and the output side observed when the trigger input is small, and shows three stable states in complementary relation.

Figure 10:
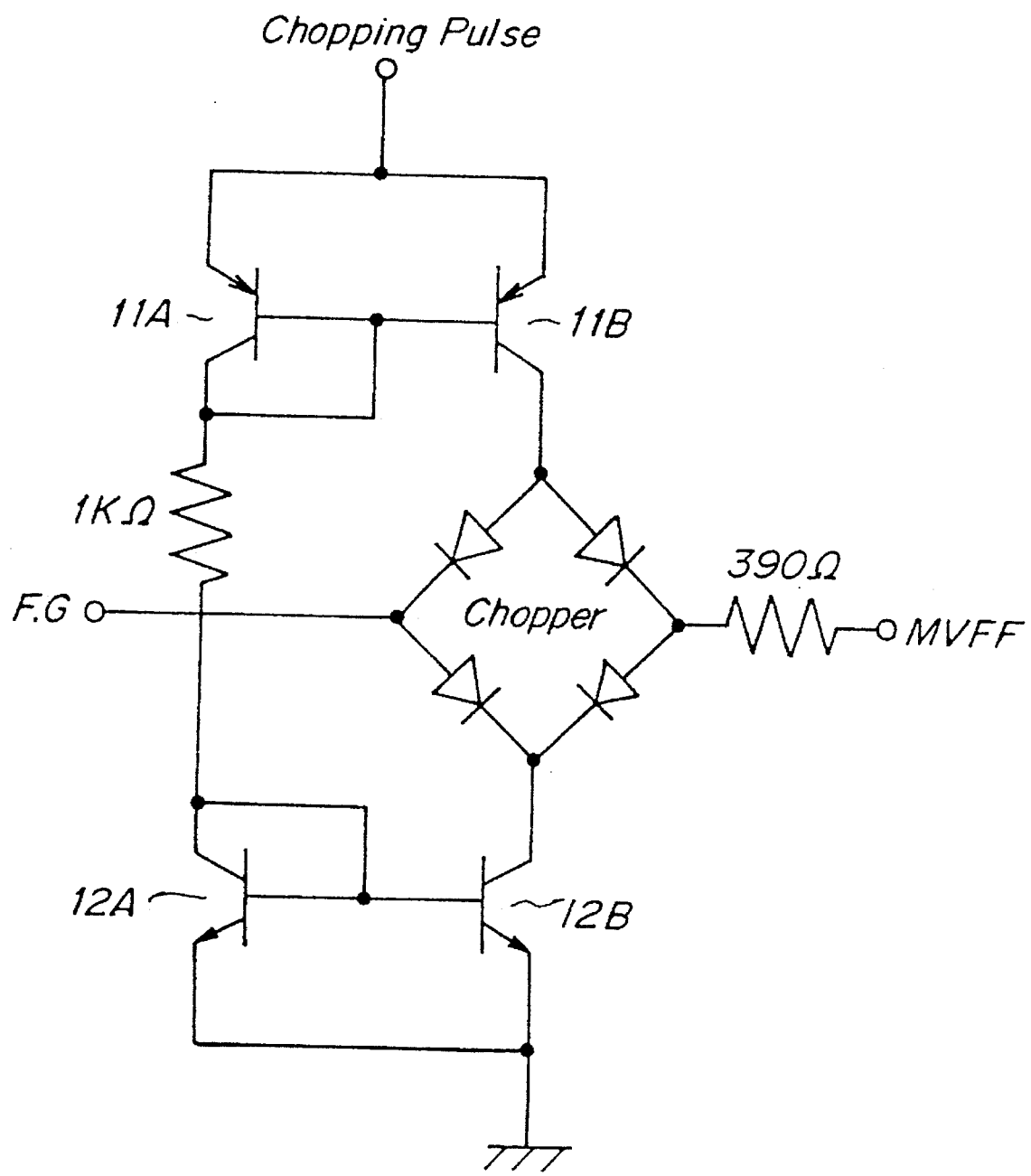
FIG. 10 is a diode bridge sampling circuit diagram with a pair of current mirror circuits.

FIG. 10 is a sampling circuit for conducting a diode bridge with a chopping pulse. A pair of current mirror circuits are used for preventing a switching current from flowing into the oscillator and the multiple-valued flip-flop circuit. Characteristics of both transistors of the current mirror circuit are the same and the same currents flow in both. The same current flows through the current mirror circuit of pnp transistors 11A, 11B and the current mirror circuit of series npn transistors 12A, 12B. When a chopping pulse voltage is applied, a current is determined at the left side circuits 11A, 12A, and the same current flows to the paired right side transistors. A voltage between collectors of the right side circuits 11B, 12B becomes a sampling output set by a voltage of the oscillator at the mid point sandwiched by diodes.

Figure 11:
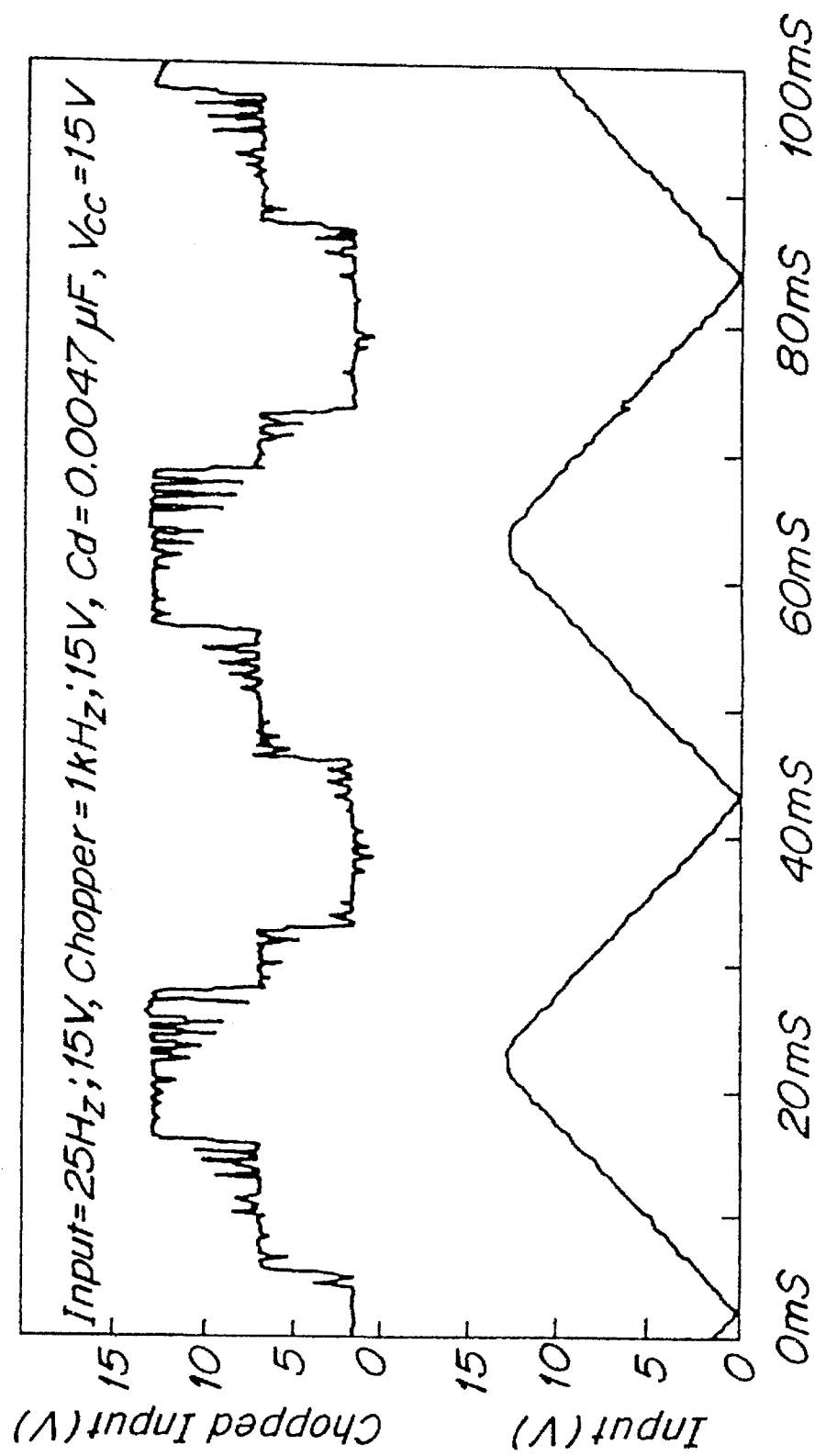
FIG. 11 shows input-output waveforms of a sampling diode bridge connected to the ternary flip-flop circuit.

FIG. 11 is a waveform of an input terminal and an output terminal of a diode bridge when a triangular wave is input in the sampling circuit of FIG. 10, and a ternary flip-flop circuit is connected to the output terminal.

An output waveform of the multiple-valued flip-flop circuit appears at the terminal on the output side. The state of the multiple-valued flip-flop circuit is determined to be either one of three stable states by the sampling input.

Figure 12:
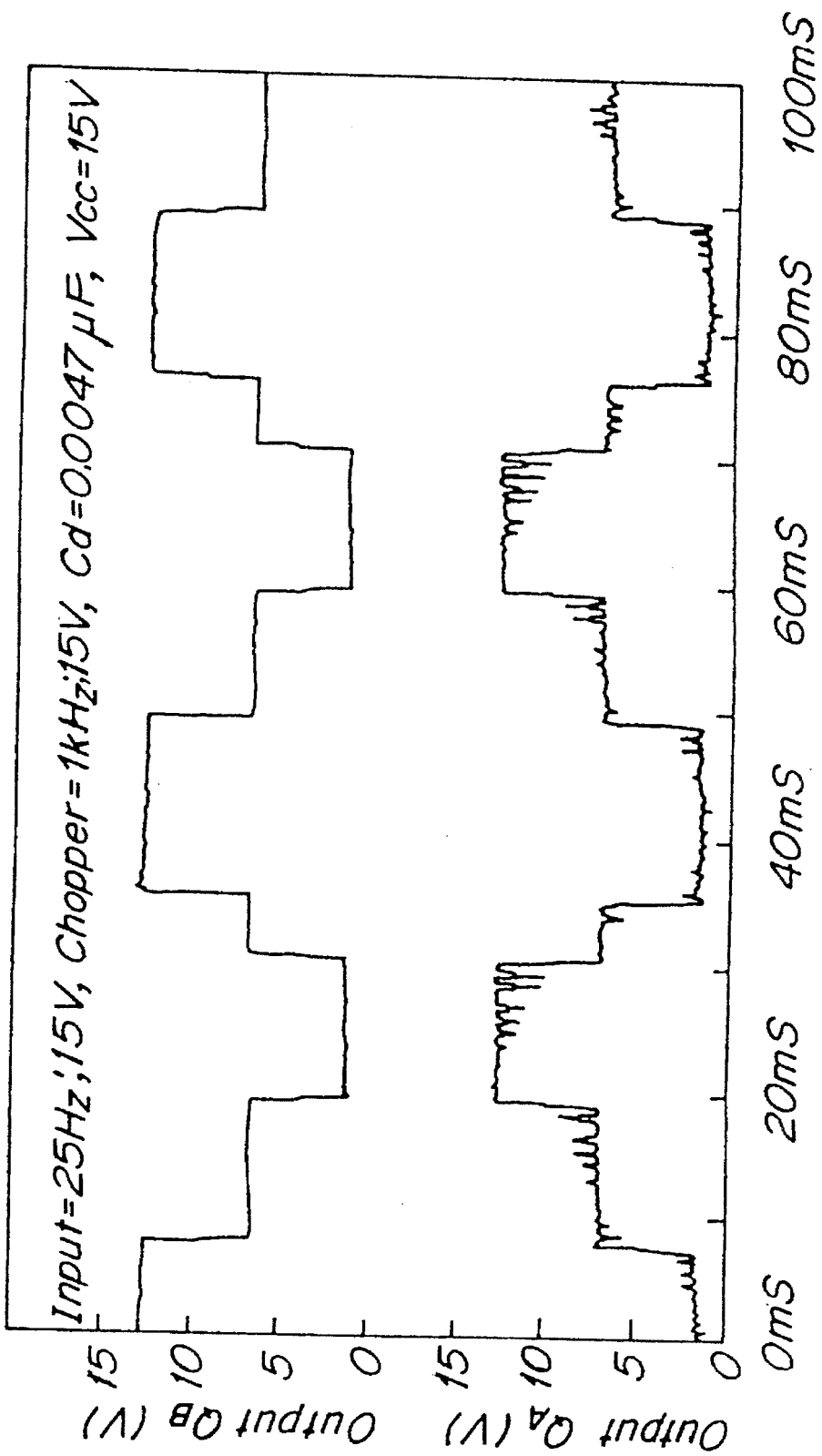
FIG. 12 is an output waveform of the ternary flip-flop circuit.

FIG. 12 shows waveforms of one output terminal $Q_A$ and the other output terminal $Q_B$ of the ternary flip-flop circuit, and a trigger waveform is observed at the terminal $Q_A$ connected to the input at the time of a high level, but the trigger level is small in case of a low level caused by on state of the transistor. A trigger waveform hardly appears in the output terminal $Q_B$ which is not connected to the input. The characteristic of this stair shaped multiple-valued flip-flop circuit is to simply increase a multiple-valued steps with the same structure.

Figure 13:
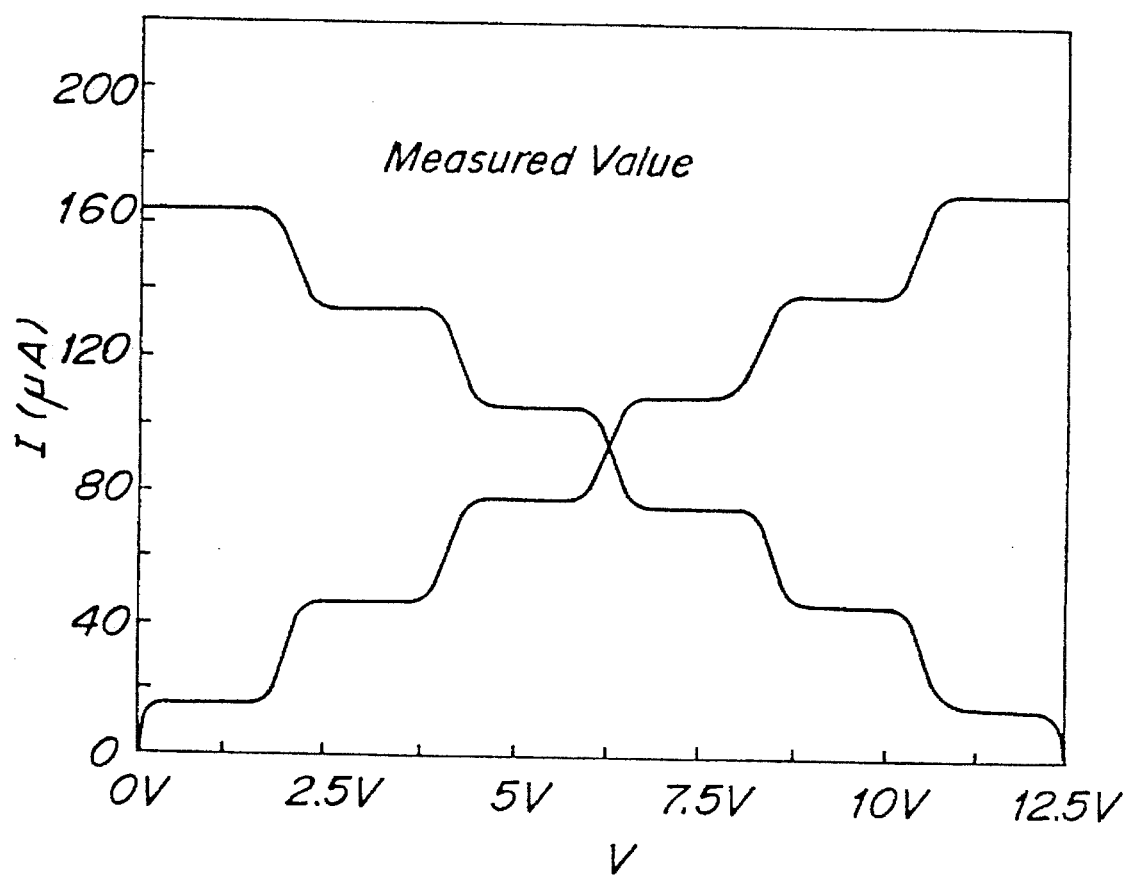
FIG. 13 is an I-V characteristic diagram of six stairs by a constant current diode and a Zener diode.

FIG. 13 shows measured values of a circuit which I-V characteristic is made 6-step stairs by a constant current diode and a Zener diode.

Figure 14:
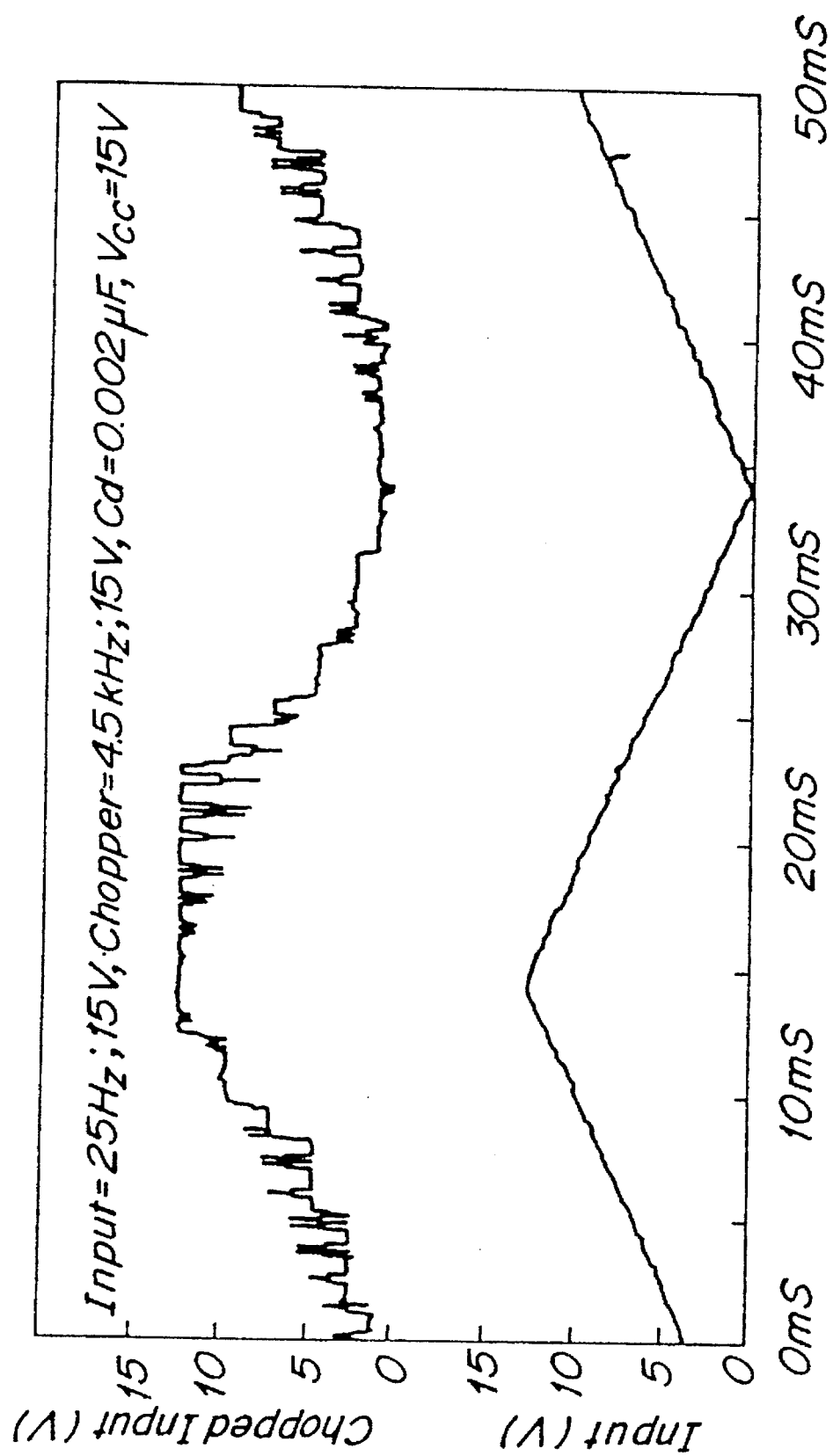
FIG. 14 shows input-output waveforms of the sampling diode bridge connected to a hexanary flip-flop circuit.

A hexanary flip-flop circuit was manufactured by using the circuit having a characteristic as shown in FIG. 13 as a coupling circuit element and by using a bipolar transistor of $h_{FE}$=300 and a load resistance of $R_L$=250 Ω. FIG. 14 shows waveforms of both terminals of a diode bridge when a triangular wave is input in the sampling circuit of FIG. 10 and the hexanary flip-flop circuit is connected to the output terminal. There is no transition, even the input trigger exceeds the intermediate stable value of the flip-flop circuit, but at the terminal of the flip-flop circuit, the state of reaching the trigger to the intermediate stable value inevitably becomes transient.

Figure 15:
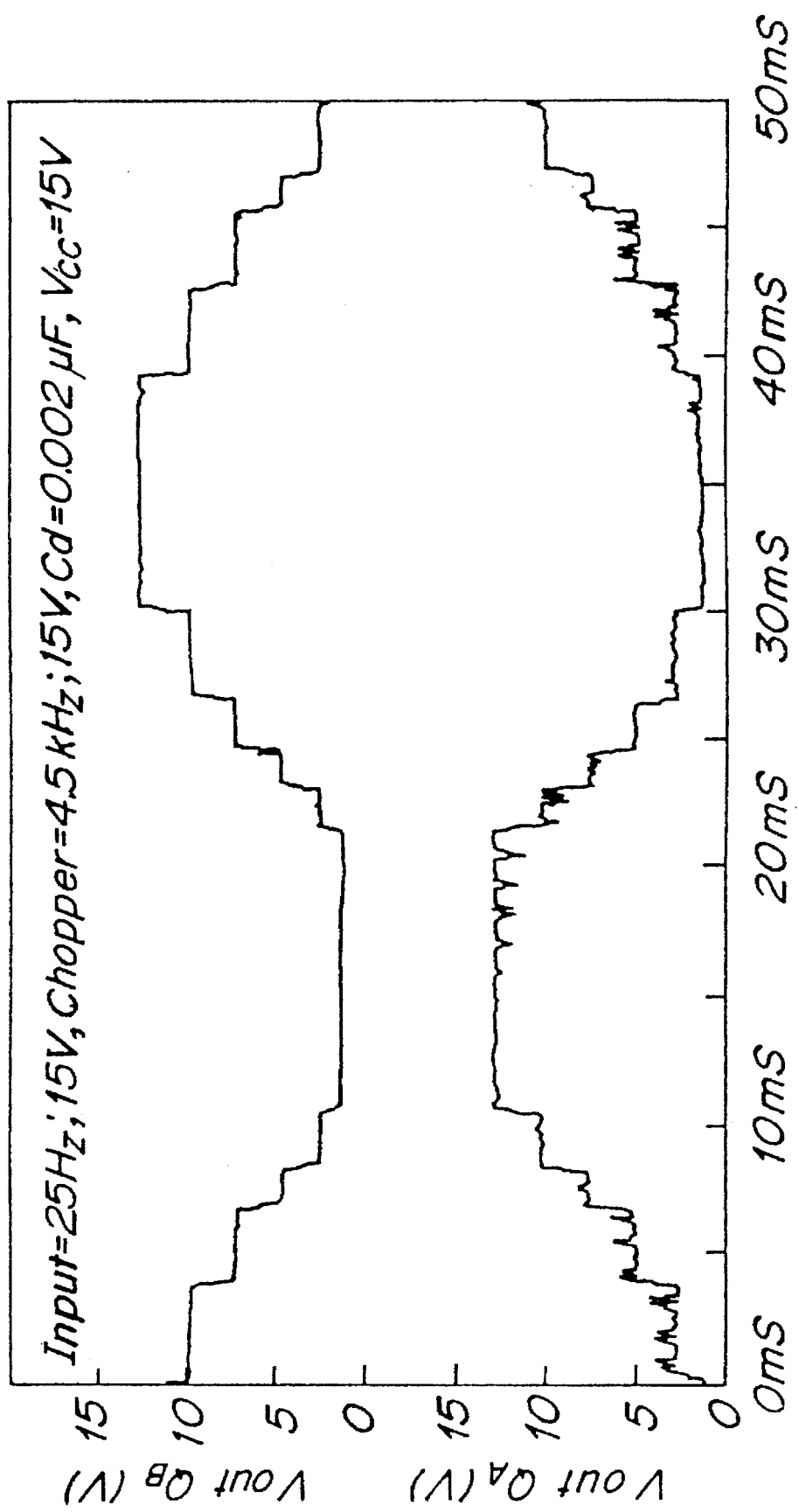
FIG. 15 is an output waveform of the hexanary flip-flop circuit.
Figure 16:
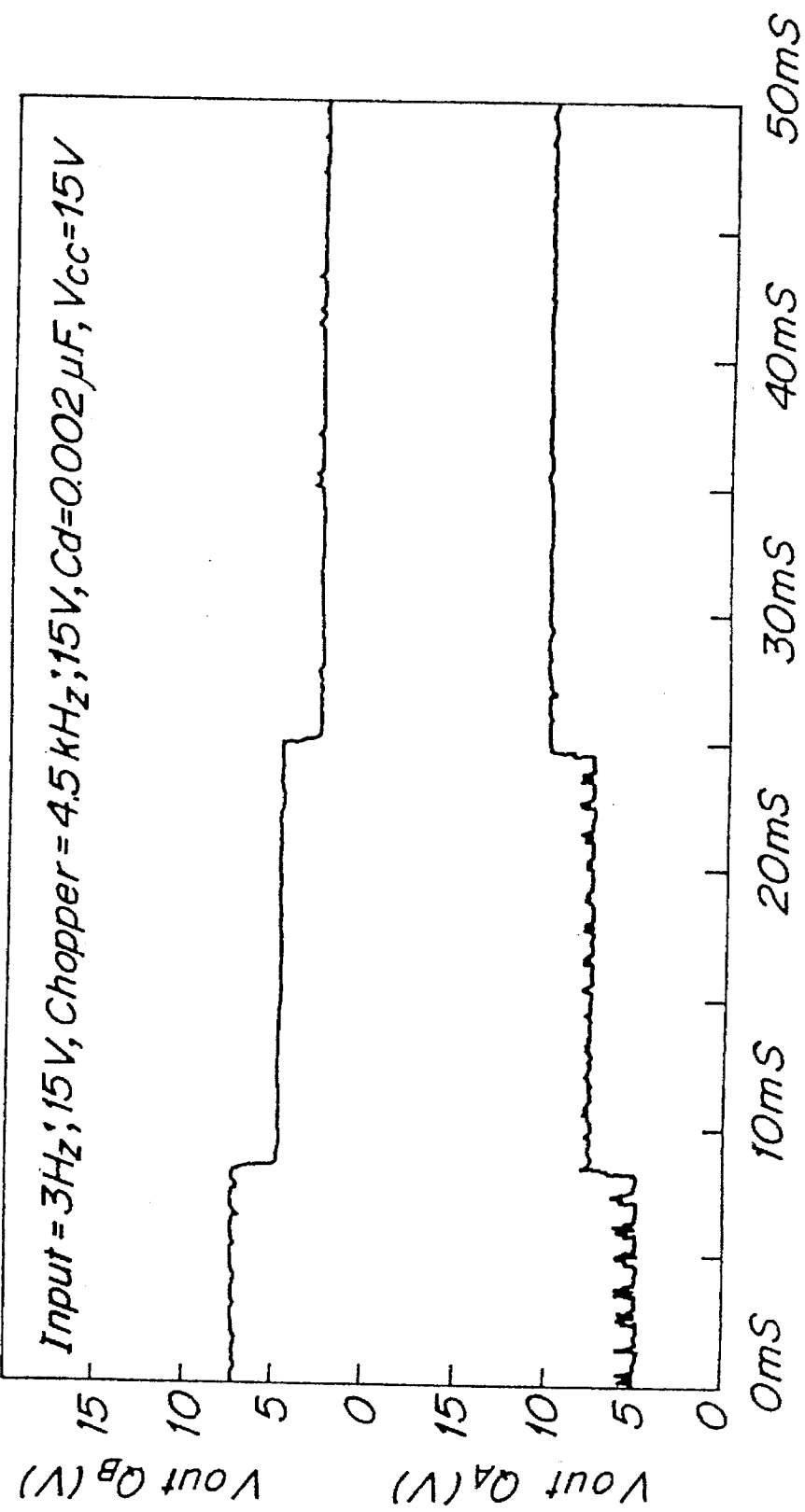
FIG. 16 is a test characteristic diagram for confirming an intermediate stable state of the hexanary flip-flop circuit.

FIG. 15 shows that six stable states are set by the sampling input and maintained with the levels of the output terminal $Q_A$ and the output terminal $Q_B$. FIG. 16 is a characteristic diagram collected for the purpose of confirming stability of the intermediated value of the multiple-valued flip-flop circuit by slow repetition of the input.

EXAMPLE 2

In order to use the stair shaped multiple-valued flip-flop circuit constructed with a semiconductor integrated circuit, it is necessary to consider the technique of assembling in the semiconductor integrated circuit. In order to materialize a multiple step function element in the semiconductor integrated circuit, a MOSFET having a gap inserted between a gate and a drain is preferred to the construction instead of constant current diodes and Zener diodes. In the present invention, as shown in FIGS. 17a–c, a rectangular gap 24 is inserted between a conventional MOSFET gate 22 and a drain 23 and connected in parallel. That is, when a stair shaped gap is inserted between the gate and the drain, and a slit is put in the gate electrode to separate by every gap, a stair shaped voltage-current characteristic is obtained.

Figure 18:
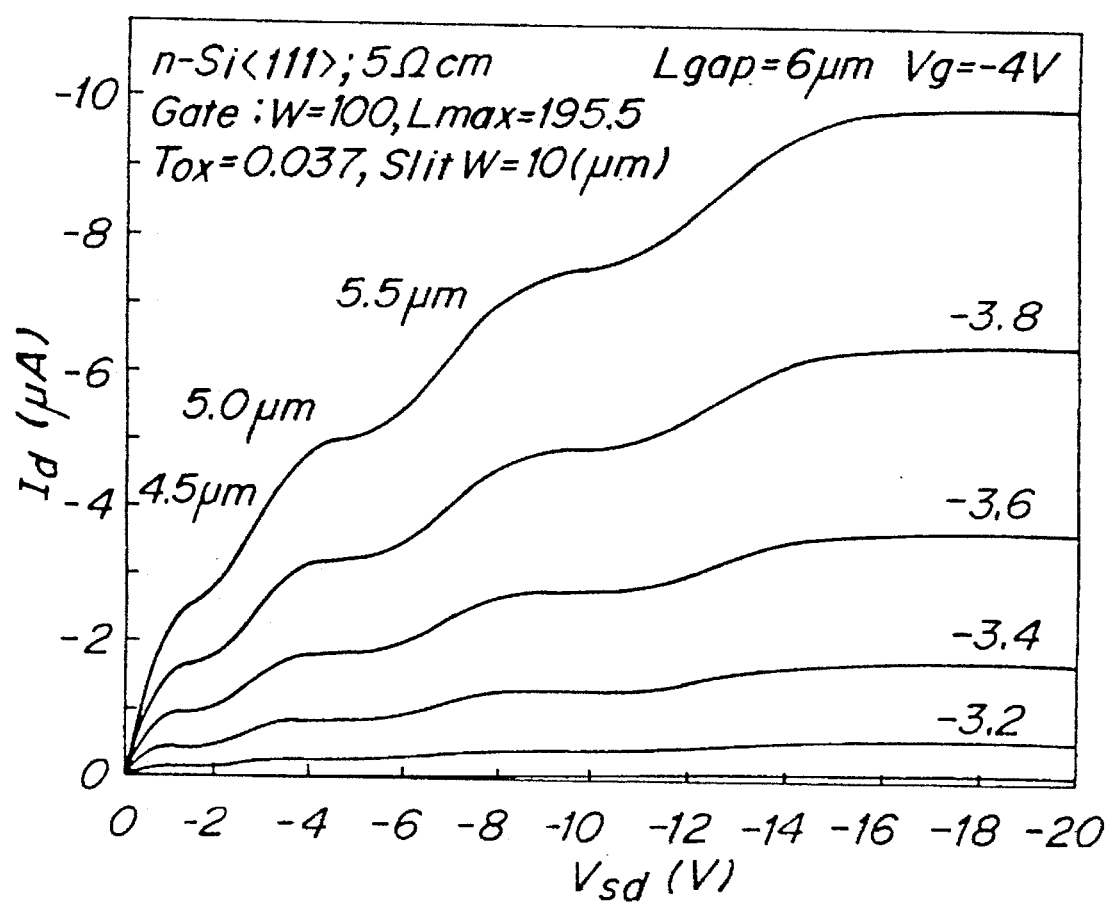
FIG. 18 is a voltage-current characteristic diagram of the multiple step function MOSFET.

FIG. 17 shows a structure of the step function MOSFET, and FIG. 18 shows its measured values.

This step function MOSFET is an element for starting to flow a drain current when a drain depletion layer 25 reaches an inversion layer 26, and shows a voltage-current characteristic having a cut-off region by the punch-through voltage as compared with the conventional MOSFET. As an operating condition for making the voltage-current characteristic sharp stairs, the gate voltage is made slightly larger than the threshold value voltage, and the saturation current region is made small. When the gate voltage is made larger, the inversion layer of the gate tends to expand and the voltage for starting to flow a current tends to become small.

Since this relates to a surface effect such as contamination of the gap portion, it is effective to form the gap portion into a projected convex form so as to produce a punch-through voltage within the inside of the semiconductor.

This multiple step function MOSFET utilizes its voltage-current characteristic, so that it is used as a 2-terminal element inserted between the input voltage and the bipolar transistor is used in order to pick up the current. Therefore, the base voltage of the transistor is applied to the source, which causes a problem of a substrate biasing voltage effect of the multiple step function MOSFET. As a result of measurement, it becomes clear that the substrate biasing voltage effect of the step function MOSFET is slightly larger than that of the conventional MOSFET, but can be handled in the same manner as the conventional MOSFET at first approximation. That is, on the basis of the source voltage, the gate voltage is used by making slightly larger than the threshold value voltage, the voltage of the drain is also considered as the voltage difference from the source voltage, and becomes slightly larger than the increase of the source voltage.

In the case of practical use, a response rate is an important study item. The gap region of the multiple step function MOSFET only functions as a pinch-off region and the multiple step function MOSFET acts under such a condition that the gate voltage is slightly larger than the threshold value voltage, an operating current is relatively small, and ON-OFF operation is different from that of a usual MOSFET. This operating condition lowers the limit of a high speed response of the element.

Figure 19:
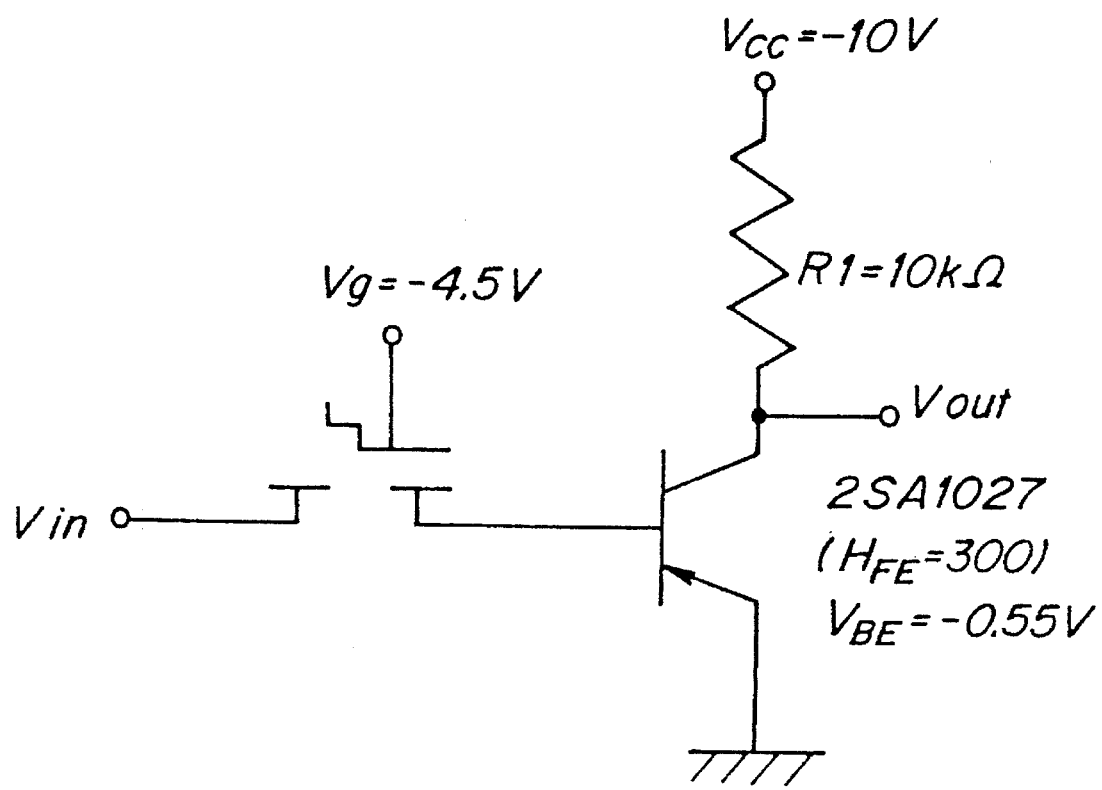
FIG. 19 is a quantized inversion amplifier circuit with the multiple step function MOSFET.
Figure 20:
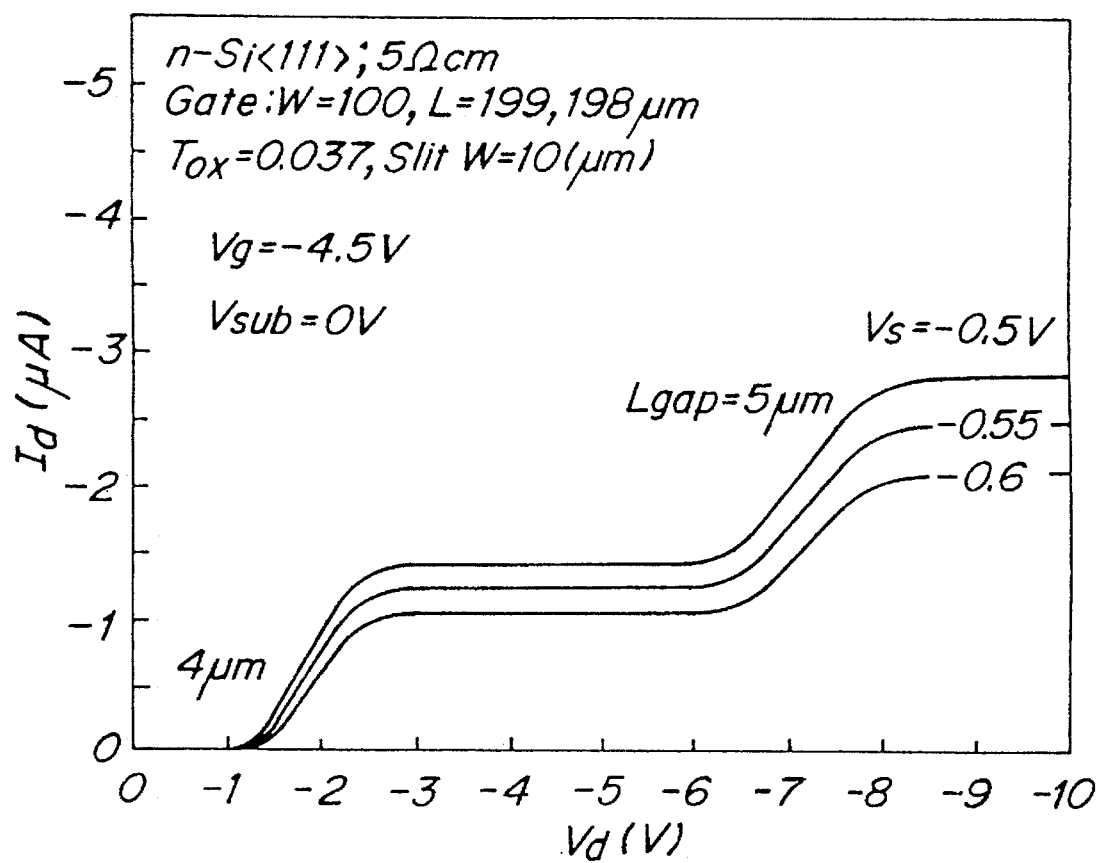
FIG. 20 is a voltage-current characteristic diagram of the multiple step function MOSFET under an assembled condition.
Figure 21:
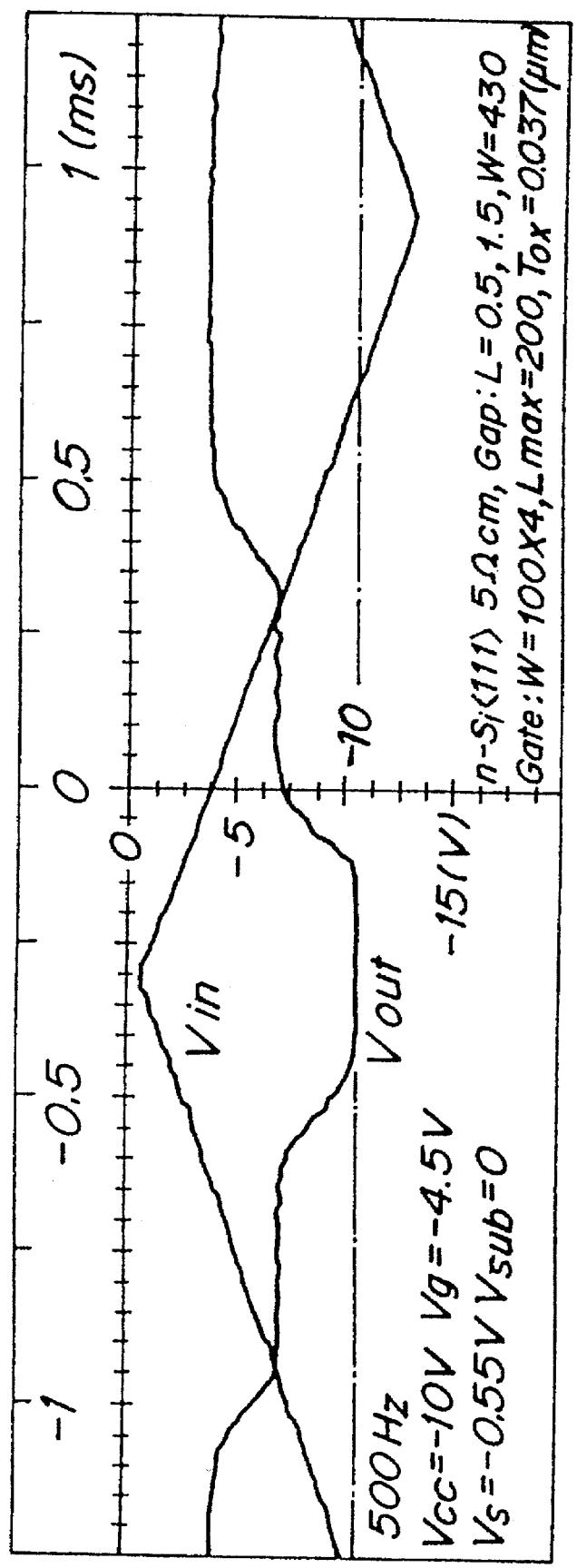
FIG. 21 is a dynamic response characteristic diagram of the quantized inversion amplifier circuit with MSFMOSFET in 500 Hz.

FIG. 19 shows a circuit diagram connecting to an emitter grounded amplifier for quantization inversion operation. This pick-up circuit has a small voltage between the base and the emitter of a bipolar transistor and a low impedance, so that the relation between an input voltage ($v_{in}$) and a base current ($I_B$) is determined by the multiple step function MOSFET. The characteristic between the base and the emitter can be approximated as a constant voltage of 0.55 V. In graphical illustration, the relation between the base current and the output voltage of the collector is given by plotting $V_{CE}$ on the abscissa and $I_C$ on the ordinate and the operating point is an intersecting point of a load line and a $I_C$-$V_{CE}$ curve. The characteristic of the multiple step function MOSFET of FIG. 20 is to apply the source voltage from −0.5 V to −0.6 V. FIG. 21 is a characteristic of this element measured by using the circuit of FIG. 19. The characteristic of FIG. 21 precisely depends on the characteristic of FIG. 20 and shows that it can faithfully respond to a repeated change of approximate 1 msec.

Figure 22:
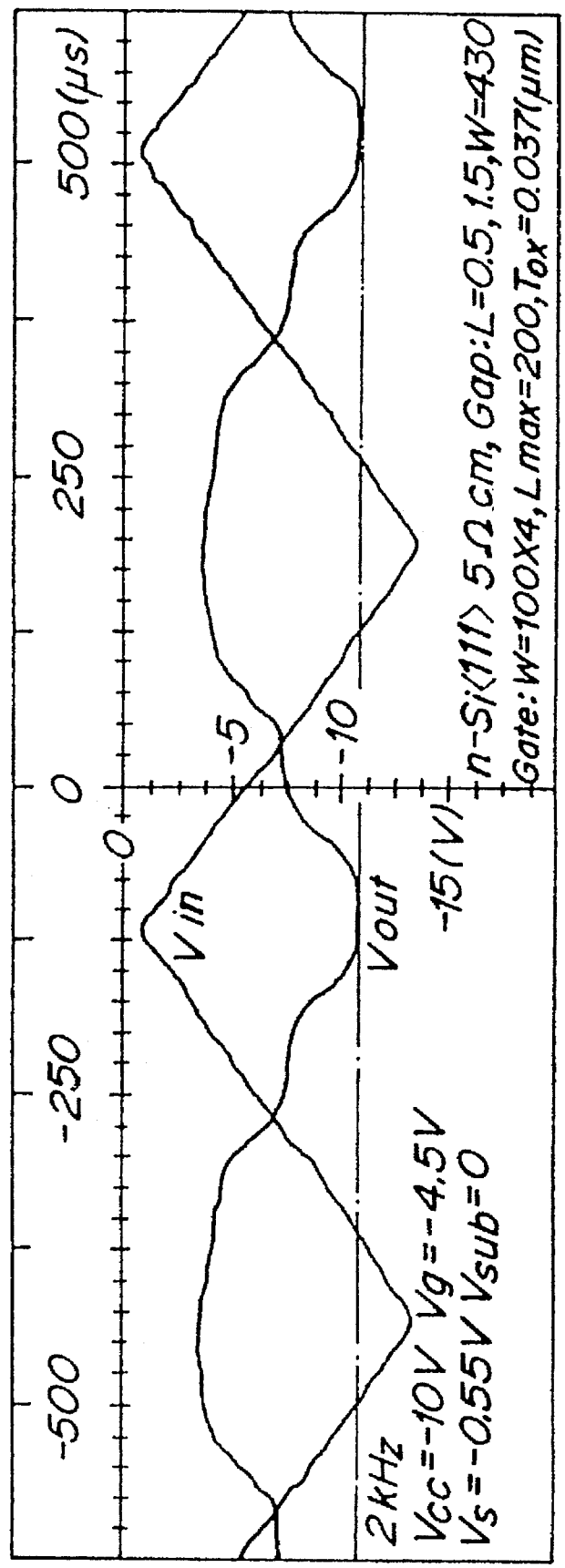
FIG. 22 is a dynamic response characteristic diagram of the quantized inversion amplifier circuit with MSFMOSFET in 2 kHz.

In the case of inputting the triangular wave of 2 kHz shown in FIG. 22, the output waveform is deformed as if it has a hysteresis. However, this waveform strain is considered to occur by constructing an integral circuit with a capacitance on the base side of a transistor and by deforming the waveform by integral operation of the triangular wave, that is, second-power characteristic. Then, the electrostatic capacitance of the gate portion of the step function MOSFET used for measurement from FIG. 17 to FIG. 22 is $T_{ox}$= 0.037, L=200, W=400 (μm), and reaches C=77 pF by calculation. This capacitance is connected to the source side and functions as a capacitance on the base side of a junction transistor.

A stair shaped voltage-current characteristic is based on a multiple step function MOSFET of a reducing structure, a gate length is L=20 μm of 1/10 and a gate width is W=30×4 μm. A high frequency response of this element has not been much improved because there was measured a characteristic superpositioned with differential waveforms caused by a bypass capacitor. It is considered that this capacitor is formed as follows. This device is made to maintain an oxidized film of a gap portion formed both the first wafer oxidation in order to generate a punch-through within the inside by thickening a concentration at the interface of phosphorus by a redistribution phenomenon, but the conductive interface having the n+ phosphorus concentration and the drain are considered to bypass through a junction capacitance in the vicinity of an inversion layer.

In order to improve the dynamic response characteristic of the multiple step function MOSFET, it is necessary to accumulate various improvements of a structure of the device by reducing a thickness of a gate oxide film to increase flowing currents, making small in size to minimize a capacitance and the like, or a means of a manufacturing process for preventing contamination for causing no electric polarizability and trap.

When the multiple-valued flip-flop semiconductor integrated circuit is examined from a point of manufacturing process, even a Bi-MOS structure, it is possible to form a diffusion resistance between a source and a drain of a MSF MOSFET, and the manufacturing process does not become complicated. If a bipolar transistor is of a lateral type, a p-type emitter and a collector can simultaneously be formed, but current amplification is rather of smaller value.

Thus, a multiple-valued flip-flop circuit consisting of a semiconductor integrated circuit becomes very compact by assembling a step function MOSFET therein.

What is claimed is:

1. An electronic multiple-valued register comprising:

a first inverted amplifier having an input and an output;

a second inverted amplifier having an input and an output; and a first electronic element having a first terminal side connected to said output of said first inverted amplifier and a second terminal side connected to said input of said second inverted amplifier and a second electronic element having a first terminal side connected to said output of said second inverted amplifier and a second terminal side connected to said input of said first inverted amplifier, said first and second electronic elements each having a substantially stair-shaped voltage-current characteristic so as to provide more than two stable levels.

2. A register according to claim 1, wherein each of said first and second electronic elements comprises at least one constant current diode and at least one Zener diode.

3. A register according to claim 1, wherein each of said first and second electronic elements comprises:

a first leg comprising a first Zener diode connected in series with a first constant current diode, said first Zener diode being biased with respect to said first constant current diode;

a second leg comprising a second Zener diode connected in series with a second constant current diode, said second Zener diode being biased with respect to said second constant current diode; and a third leg comprising a third constant current diode, said first, second and third legs being connected in parallel.

4. A register according to claim 1, wherein each of said first and second electronic elements has a predetermined number of steps in said characteristic and comprises:

a MOSFET having a gate, a drain at said first terminal side and a source at said second terminal side, wherein a gap between said gate and said drain has a substantially stair-shape including a plurality of distinct levels corresponding to said predetermined number.

5. A register according to claim 4, wherein said MOSFET is a multiple step function MOSFET.

6. A register according to claim 1, wherein said first and second inverted amplifiers each comprise a bipolar transistor.

7. A register according to claim 6, further comprising an electrostatic capacitor connected in parallel between a collector of the bipolar transistor of said first inverted amplifier and a collector of the bipolar transistor of said second inverted amplifier so as to stabilize said register.

8. An electronic element having a substantially stair-shaped voltage-current characteristic comprising:
- a first leg comprising a first Zener diode connected in series with a first constant current diode, said first Zener diode being biased with respect to said first constant current diode;
- a second leg comprising a second Zener diode connected in series with a second constant current diode, said second Zener diode being biased with respect to said second constant current diode; and
- a third leg comprising a third constant current diode,
- said first, second and third legs being connected in parallel.

9. An electronic multiple-value register comprising:
- a flip-flop circuit having an input and an output, and including first and second inverted amplifiers each having an input and an output; and
- a first electronic element having a first terminal side connected to said output of said first inverted amplifier and a second terminal side connected to said input of said second inverted amplifier and a second electronic element having a first terminal side connected to said output of said second inverted amplifier and a second terminal side connected to said input of said first inverted amplifier, said first and second electronic elements each having a substantially stair-shaped voltage-current characteristic so as to provide more than two stable levels.

10. A register according to claim 9, wherein said first and second inverted amplifiers each comprise a bipolar transistor.

11. A register according to claim 10, further comprising an electrostatic capacitor connected in parallel between a collector of the bipolar transistor of said first inverted amplifier and a collector of the bipolar transistor of said second inverted amplifier so as to stabilize said register.

12. A register according to claim 9, wherein each of said first and second electronic elements comprises at least one constant current diode and at least one Zener diode.

13. A register according to claim 9, wherein each of said first and second electronic elements has a predetermined number of steps in said characteristic and comprises a MOSFET having a gate, a drain at said first terminal side and a source at said second terminal side, wherein a gap between said gate and said drain has a substantially stair-shape including a plurality of distinct levels corresponding to said predetermined number.

14. A register according to claim 13, wherein said MOSFET is a multiple step function MOSFET.

15. A register according to claim 9, wherein each of said first and second electronic elements comprises:
- a first leg comprising a first Zener diode connected in series with a first constant current diode, said first Zener diode being biased with respect to said first constant current diode;
- a second leg comprising a second Zener diode connected in series with a second constant current diode, said second Zener diode being biased with respect to said second constant current diode; and
- a third leg comprising a third constant current diode,
- said first, second and third legs being connected in parallel.

* * * * *